United States Patent
Principato

(10) Patent No.: US 11,113,432 B2
(45) Date of Patent: Sep. 7, 2021

(54) ENCODING IMAGES ON PHYSICAL OBJECTS TO TRACE SPECIFICATIONS FOR A MANUFACTURING PROCESS

(71) Applicant: Micron Technology, Inc., Boise, ID (US)

(72) Inventor: Giuseppe Principato, Poing (DE)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 16/408,097

(22) Filed: May 9, 2019

(65) Prior Publication Data

US 2020/0356640 A1 Nov. 12, 2020

(51) Int. Cl.
| | |
|---|---|
| *G06F 30/15* | (2020.01) |
| *G06F 16/955* | (2019.01) |
| *G06Q 10/06* | (2012.01) |
| *G06K 19/06* | (2006.01) |
| *G06K 7/14* | (2006.01) |

(52) U.S. Cl.
CPC .......... *G06F 30/15* (2020.01); *G06F 16/9554* (2019.01); *G06K 7/1417* (2013.01); *G06K 19/06037* (2013.01); *G06Q 10/06395* (2013.01)

(58) Field of Classification Search
CPC .... G06F 13/30; G06Q 10/0639; G06Q 10/06; G06K 19/06
See application file for complete search history.

(56) References Cited

U.S. PATENT DOCUMENTS

| | | | |
|---|---|---|---|
| 5,578,269 | A | 11/1996 | Yaremko et al. |
| 7,100,826 | B1 | 9/2006 | Phan et al. |
| 7,231,354 | B1 | 6/2007 | Rooks et al. |
| 10,248,765 | B1 | 4/2019 | Holmes et al. |
| 10,809,696 | B1 | 10/2020 | Principato |
| 2002/0052862 | A1* | 5/2002 | Scott ............. G06Q 10/087 |

(Continued)

OTHER PUBLICATIONS

Updating Manufactured Product Life Cycle Data in a Database Based on Scanning of Encoded Images, U.S. Appl. No. 16/408,146, filed May 9, 2019, Giuseppe Principato, Non Final Action Counted, Not Yet Mailed, dated Mar. 24, 2020.

(Continued)

*Primary Examiner* — Thien M Le
*Assistant Examiner* — Asifa Habib
(74) *Attorney, Agent, or Firm* — Greenberg Traurig

(57) ABSTRACT

A method includes: receiving, from a manufacturer, a first printed document including specifications for a product and a first encoded image; sending, to the manufacturer, a second printed document, wherein the second printed document includes a second encoded image; receiving, from the manufacturer, a third printed document that corresponds to revisions to the specifications and includes a third encoded image; scanning the third encoded image; determining, based at least on scanning the third encoded image, that the third printed document corresponds to at least one of the first printed document or the second printed document; and in response to determining that the third printed document corresponds to at least one of the first printed document or the second printed document, making the product in conformance with the specifications.

20 Claims, 11 Drawing Sheets

(56) References Cited

U.S. PATENT DOCUMENTS

| | | | |
|---|---|---|---|
| 2003/0154144 A1* | 8/2003 | Pokorny | G06Q 10/10 705/28 |
| 2005/0016235 A1 | 1/2005 | Zusi | |
| 2005/0040223 A1 | 2/2005 | Yigit et al. | |
| 2005/0240441 A1 | 10/2005 | Suzuki et al. | |
| 2006/0041502 A1 | 2/2006 | Blair et al. | |
| 2007/0240154 A1 | 10/2007 | Gerzymisch et al. | |
| 2007/0296598 A1 | 12/2007 | Kim | |
| 2008/0017722 A1* | 1/2008 | Snyder | G06Q 10/00 235/494 |
| 2009/0028417 A1* | 1/2009 | Floeder | G01N 21/89 382/141 |
| 2011/0178627 A1* | 7/2011 | Wechter | G05B 19/41875 700/109 |
| 2012/0253875 A1* | 10/2012 | Harsh | G06Q 10/06395 705/7.15 |
| 2013/0197842 A1* | 8/2013 | Ugorji | G06Q 10/06395 702/82 |
| 2015/0066187 A1 | 3/2015 | Berg et al. | |
| 2018/0169858 A1 | 6/2018 | Jain et al. | |
| 2018/0240129 A1 | 8/2018 | Chuptys | |
| 2018/0326138 A1 | 11/2018 | Kalaskar et al. | |
| 2019/0115098 A1 | 4/2019 | Gitchell et al. | |
| 2020/0090111 A1 | 3/2020 | Heil et al. | |

OTHER PUBLICATIONS

Structured Server Access for Manufactured Product Based on Scanning of Encoded Images, U.S. Appl. No. 16/408,165, filed May 9, 2019, Giuseppe Principato, Non Final Action dated Apr. 23, 2020.

Marking Integrated Circuit Package With Encoded Image for Scanning to Obtain Manufacturing Parameters, U.S. Appl. No. 16/408,086, filed May 9, 2019, Giuseppe Principato, Docketed New Case—Ready for Examination, Jun. 27, 2019.

Scanning Encoded Images on Physical Objects to Determine Parameters for a Manufacturing Process, U.S. Appl. No. 16/408,078, filed May 9, 2019, Giuseppe Principato, Allowed—Notice of Allowance Not Yet Mailed, dated Jun. 9, 2020.

Automatically Updating Database Records Regarding Materials Used in Manufacturing based on Scanning of Encoded Images, U.S. Appl. No. 16/408,125, filed May 9, 2019, Giuseppe Principato, Docketed New Case—Ready for Examination, Jun. 20, 2019.

Controlling Transport of Physical Objects Based on Scanning of Encoded Images, U.S. Appl. No. 16/408,117, filed May 9, 2019, Giuseppe Principato, Response to Non-Final Office Action Entered and Forwarded to Examiner, dated Jun. 5, 2020.

Updating Manufactured Product Life Cycle Data in a Database Based on Scanning of Encoded Images, U.S. Appl. No. 16/408,146, filed May 9, 2019, Giuseppe Principato, Docketed New Case—Ready for Examination, Jun. 18, 2019.

Structured Server Access for Manufactured Product Based on Scanning of Encoded Images, U.S. Appl. No. 16/408,165, filed May 9, 2019, Giuseppe Principato, Docketed New Case—Ready for Examination, Jun. 20, 2019.

Scanning Encoded Images on Physical Objects to Determine Parameters for a Manufacturing Process, U.S. Appl. No. 16/408,078, filed May 9, 2019, Giuseppe Principato, Application Dispatched from Preexam, Not Yet Docketed, Jun. 7, 2019.

* cited by examiner

FIG. 4

| Type | description code | Value |
|---|---|---|
| PC | PPAP code | 100001100 |
| MPN | Marketing part number | MTFC4GLGDQ-AIT Z |
| PKG | Packing code | BGA |
| CTM | Customer | |
| CPN | Customer Part Number | 55061300 |
| SN | SAP Number | 223988 |
| DID | Design ID | J55U |
| SGMT | Segment or application | Automotive |
| FABF | Fabrication Facilities | FAB6 |
| FABP | Test Probe facilities | FAB6 FAB13 |
| Assy | Assembling facilities Plant | MSB |
| TEST | testing facilities Plant | MSA |
| SP | Shipment location plant | SG15 |
| SBPP | SOLDER BALL PAD PLAT | NiAu |
| WT | Wire Type | Gold |
| IM | Interposer Material | IMDS |
| TWT | Target WAF Tackiness | 0.3mm |
| ECT | Encamp Compound Type | EMEG771S |
| WBAT | ADHESIVE TAPE TYPE | HR-9070GT-20 |
| SC | SOLDER COMPOSITION | 96.5SN/3AG/.5CU |
| SSD | SOLDER SPHERE DIAM | 0.457mm |
| AD | ASIC DESIGN ID | PS8200 |

FIG. 5

ENCODING IMAGES ON PHYSICAL OBJECTS TO TRACE SPECIFICATIONS FOR A MANUFACTURING PROCESS

FIELD OF THE TECHNOLOGY

At least some embodiments disclosed herein relate to scanning of encoded images in general and more particularly, but not limited to using encoded images on physical objects to trace specifications for a manufacturing process.

BACKGROUND

A Quick Response Code is a type of barcode (sometimes referred to as a QR Code barcode, or simply a QR code). In some cases, a QR code is a machine-readable optical label that contains information about a physical item to which the QR code is attached. The QR code can include, for example, data for a locator, an identifier, or a tracker that points to a website or application. A QR code can, for example, use various standardized encoding modes to store data. These can include numeric and alphanumeric modes.

In some cases, a QR code contains black squares arranged in a two-dimensional square grid on a white background. The QR code can be read by an imaging device such as a camera, and processed using error correction until the image can be interpreted. Several standards exist that cover the encoding of data as QR codes (e.g., ISO/IEC 18004:2015).

In some cases, a smart phone can be used as a QR code scanner. The smart phone can convert the QR code to useful data of some type, such as a standard URL for a website. In one example, a user with a camera phone equipped with a reader application can scan an image of a QR code to display text, contact information, connect to a wireless network, or open a webpage in a browser on the phone.

A QR code can also be linked to a location to track where a code has been scanned. In one example, an application that scans the QR code can retrieve geo-information by using GPS, etc.

In some cases, QR codes are used with mobile device operating systems. The mobile device can support URL redirection, which allows QR codes to send metadata to an existing application on the device.

A QR code differs from older, one-dimensional barcodes designed to be mechanically scanned by a narrow beam of light. A QR code is detected, for example, by a two-dimensional digital image sensor, and then digitally analyzed by a programmable processor.

BRIEF DESCRIPTION OF THE DRAWINGS

The embodiments are illustrated by way of example and not limitation in the figures of the accompanying drawings in which like references indicate similar elements.

FIG. 4 shows an example Production Part Approval Process (PPAP) document having a QR code on the document, according to one embodiment.

FIG. 5 shows an example set of parameter types and corresponding parameter values that can be encoded in a QR code, according to one embodiment.

DETAILED DESCRIPTION

Figure 1:
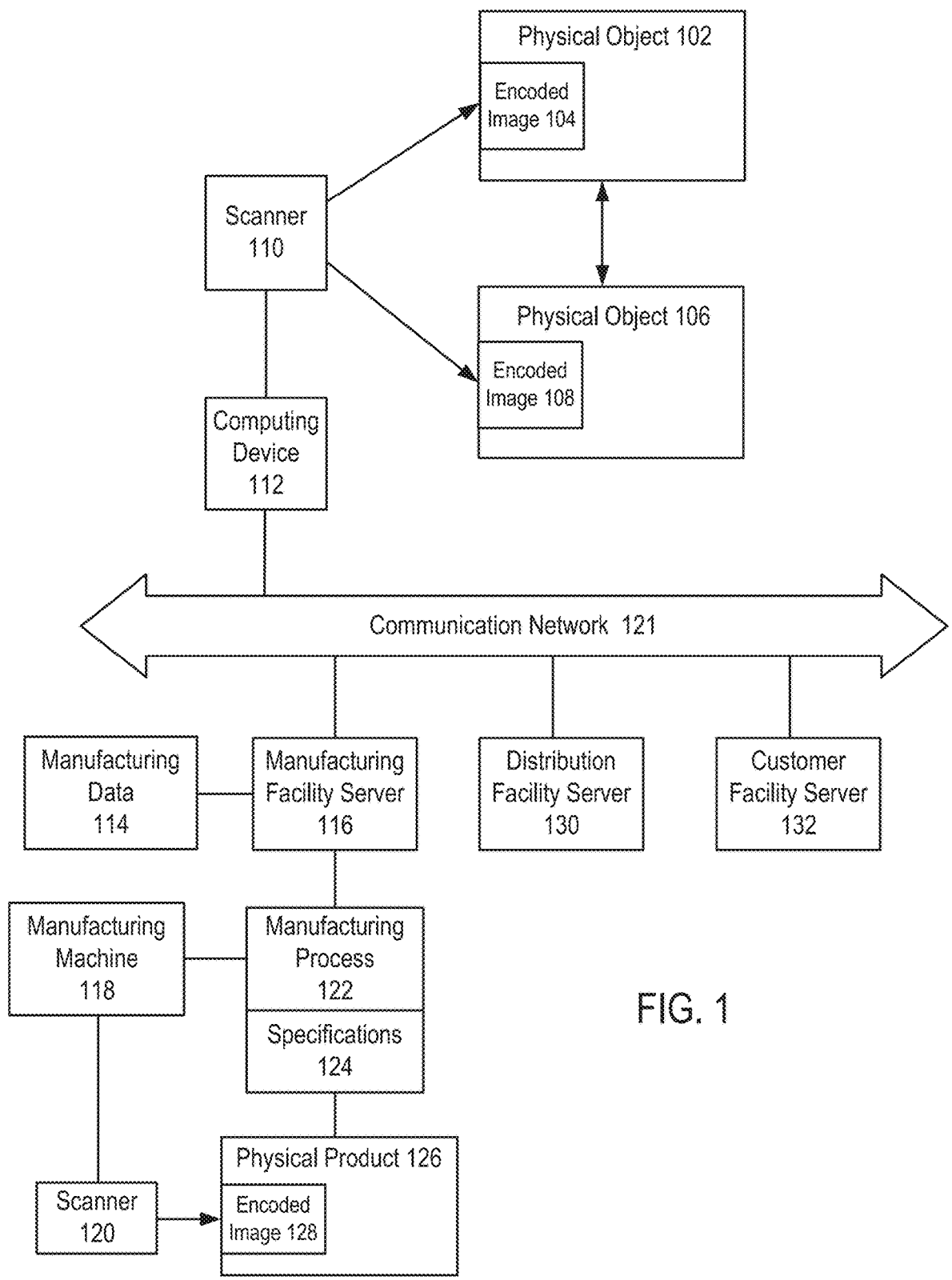
FIG. 1 shows an example computing system for scanning encoded images on physical objects to determine parameters for a manufacturing process, according to one embodiment.

At least some embodiments herein relate to scanning encoded images (e.g., QR codes) on physical objects (e.g., physical components, printed documents, and/or labels) to determine and/or evaluate parameters for a manufacturing process (e.g., silicon wafer processing parameters for making a memory device for an automobile).

Other embodiments relate to using encoded images on physical objects to trace specifications for a manufacturing process. In one embodiment, specifications for a product (e.g., a non-volatile memory device) made by a manufacturing process are traced by a unified QR code printed on various paper documents that are exchanged among multiple parties involved in the manufacturing process. In one example, the paper document is a label that is applied to a document or other physical object. In one example, the paper document is a printed production part approval process (PPAP) or other document as described below. In other embodiments, the printed document can be made of other materials such as plastic, plastic-laminated paper, etc. In one example, the parties are a memory device supplier and a vehicle manufacturer that integrates the memory into an autonomous vehicle (e.g., the autonomous vehicle of FIG. 12). Various embodiments regarding using encoded images on physical objects to trace specifications for a manufacturing process are described in the section below titled "Using Encoded Images to Trace Specifications for a Manufacturing Process".

A Production Part Approval Process (PPAP) is, for example, used in an automotive industry production chain to ensure the approval of component suppliers and their production processes. For example, the PPAP was created and adopted by the three large American companies in the automotive industry (Chrysler, Ford and General Motors). The first version of the PPAP was published in February 1993, and is in the context of the IATF standard 16949:2016.

When making a product such as a memory device for an automobile, various aspects of the product are conventionally negotiated/communicated among suppliers, customers/buyers, and/or subcontractors through the exchange of decks of printed papers. For example, a supplier may produce memory chips for automobile manufacturing companies as customers/buyers. Such printed papers can include one or more of the following:

PPAP (Production Part Approval Process): used by a supplier to describe various technical and logistical aspects of a version of the product to be provided by the supplier (e.g., the process to make a chip, the process to test the chip, the design parameters of the chip, and/or materials used in the chip).

PSW (Part Submission Warrant): a warrant of the supplier provided for samples of the product.

PCN (Product Change Notification): a proposed change made by supplier to PPAP.

EOL (End-of-Life): a notification provided by supplier to customer/buyer.

CCR (Customer Containment Rules): which versions of products can be shipped to which customers.

BOM (Build of Material, or Bill of Material): a documentation identifying the components of a version of a product.

Conventionally, a supplier makes a batch of samples of a product that is described/documented using a PPAP, which includes a warrant in the form of PSW. The customer/buyer inspects/tests the samples. If the sample/PPAP is not accepted, the supplier may make improved samples with an updated PPAP. If the buyer accepts to buy a version of samples, the buyer signs off its associated PSW and returns the signed PSW back to the supplier as approval. The approved PSW and its associated PPAP will be used by the supplier to organize the manufacture/production of the product and the shipping of the product to the buyer. The quality of the product is safe-guarded (e.g., guaranteed to a degree) by the specifications set forth in approved PPAP/PSW, and the samples that have been produced according to the approved PPAP/PSW and inspected by the buyer for the approval given in the PSW.

If the supplier makes a change to an approved PPAP, the supplier has to send a PCN to the buyer for approval. Once PCN is approved, a set of a sample and PPAP may be generated for an approved PSW from the buyer.

An EOL is used by the supplier to inform the buyer of the end of life of a specific product. A CCR is used by the supplier to organize the shipping of different versions of products to different customers. A BOM is used by the supplier to coordinate with subcontractors to organize the production of the product.

Since the contents of the PPAP, PSW, PCN, EOL, CCR and BOM are typically significantly different from product to product, the contents are typically printed on paper and processed by a human through reading and human intelligence. This can cause various problems including increased manufacturing errors when making memory or other devices (e.g., due to human error in reading wafer processing or device testing conditions), time-consuming manual review of paper documents, and inefficiency when coordinating processing operations, and/or logistics between a supplier and its customers, subcontractors, and/or distributors.

Various embodiments of the present disclosure provide a technological solution to one or more of the above technical problems. In some embodiments, QR codes can be used to improve the usage of PPAP, PSW, PCN, EOL, CCR and/or BOM. In general, a QR code can be used to encode at least some of the information that are printed in the papers. Samples of such information to be encoded in QR code may include identifiers (e.g., of materials and entities), restrictions, parameters, measurements, values, sizes, and/or manufacturing facility (e.g., plant) locations. Samples of information typically not suitable for being encoded in a QR code, and thus requiring reading and handling by a human, include drawings and diagrams.

In one example, a QR code is a two-dimensional barcode (or 2D code) that is a matrix, composed of black modules arranged within a white pattern having a square shape. The matrix of the QR code is used to store information, and the QR code is sometimes intended to be read by a mobile device (e.g., by an application executing on a smartphone and using a camera of the smartphone). In one example, up to 7,089 numeric or 4,296 alphanumeric characters can be contained in the encoded image (e.g., a single cryptogram) of the QR code. The matrix format is, for example, 29×29 squares and contains 48 alphanumeric characters.

In one embodiment, once the information is encoded using a QR code, at least some processing of PPAP and/or other documents can be automated through computer processing. For example, a mobile phone with an application (sometimes referred to as simply an "app") can be used to scan the QR code to extract the information encoded therein. For example, two QR codes from two PPAPs can be compared by the mobile app to show the differences and common aspects. Two QR codes from two documents can be compared by the mobile app to determine whether the two documents are a match for the development of a product (e.g., a PPAP and a corresponding PCN).

In one embodiment, the mobile app can be connected to a server to further link the QR code/PPAP to other information stored in a server (e.g., drawings and diagrams). For example, each PPAP can have a unique version identifier that is encoded in the QR code. Thus, the QR code of a PPAP can be used to look up the identification of samples. Similarly, the same QR code of the PPAP can be printed on the PSW. Thus, when a PSW is received, the QR code can be scanned to correlate it with the PPAP.

In one embodiment, based on the information encoded in the QR code printed on PSW (and/or associated information pre-linked to the QR code/PPAP), a computer system can automate at least part of the process of inserting the conditions of CCR. In general, a same batch of products may meet the requirements of several buyers. A PPAP/PSW defines the requirements of a customer. A QR code can be initially added as an input to CCR. The computer system can be programmed to automatically determine whether the batch of the products meets the requirements of the PPAP/PSW (at least in part).

Similarly, a QR code of PPAP can be entered as part of BOM. This allow the automatic identification of some of the component supplier relations.

The QR code having the information of PPAP can also be printed on other documents to drive production, such as documentations shipped with products to buyers, orders to subcontractors, and components from subcontractors.

In one embodiment, each PPAP associated with a batch of samples has a single QR code. The QR code has a set of parameters unique to the samples. Any subsequent documents related to the samples is provided with the same QR code, such that the information can be accessed using a scanner (e.g., by a mobile app using a camera or other lens) without a need to connect to a server. However, a server can be used to provide additional information about the PPAP. The access to the additional information may be privileged (e.g., require authentication of a device requesting the access).

In some instances, a QR code may include a descriptive message specific to a situation (e.g., data observed and/or collected at one or more steps of a manufacturing process when making a sample). For example, the descriptive message may indicate the reason for which the PPAP is generated (e.g., due to a PCN, a customer letter/request, etc.).

In one embodiment, a computer application is executing on a mobile device. A scanner of the mobile device is used to scan one or more QR codes on paper or other printed documents (e.g., PPAP, PSW, and/or PCN on paper, label, etc.). Based on scanning the QR codes and comparing parameters encoded in the QR codes, parameters of a manufacturing process can be negotiated, and manufacturing of a physical product authorized.

In one embodiment, a PPAP is used to determine whether all requirements, both design and product, are met, and/or whether a supplier's manufacturing process is capable of maintaining these requirements in a series production. By using a QR code as described herein, marking for traceability of specific customer requirements between data information (e.g., parameters and values) can be ensured. The QR code can support a faster data comparison, and/or add a major synthesis to increase attention in the management of data shared by a supplier with automotive customers.

In light of the above, using the QR code on documents can provide various advantages. For example, the traceability of the product to documents (e.g., PPAP document) can be improved. In other examples, the extraction parameters and corresponding values can be used in a table format. Also, incoming inspection can be improved. In addition, the introduction of the QR code in a document (PPAP) and/or on another physical object should have minimal cost. Further, the traceability of the documents to products can be improved. In some cases, delivery of product to customers can be more rapid due to improved handling and/or logistics efficiencies. Also, traceability of batch stock to link to PPAP(s) can be improved.

FIG. 1 shows an example computing system for scanning encoded images 104, 108 on physical objects 102, 106 to determine parameters for a manufacturing process 122, according to one embodiment. In FIG. 1, a computing device 112 can be used to access, communicate with, and/or interact with manufacturing facility server 116, a distribution facility server 130, and/or customer facility server 132 over a communication network 121 (e.g., the Internet, a wide area network, a local network, or other wired or wireless communications network). The access, communication, or interaction can relate to a product (e.g., a memory device for an automobile) that is being manufactured using manufacturing process 122. In some cases, the product is a sample to be made and approved by a customer prior to volume manufacture of a commercial product.

Computing device 112 is coupled to a scanner 110 used to scan encoded images. Specifically, scanner 110 can be used to scan encoded image 104 on physical object 102, and/or to scan encoded image 108 on physical object 106. Encoded images 104 and 108 are scanned to determine parameters associated with the manufacturing process 122. In some cases, the determined parameters are compared using computer device 112. In some embodiments, physical object 102 and physical object 106 include computing devices that can communicate, for example, using a wireless connection.

The parameters determined from encoded images 104, 108 relate to the product to be made using manufacturing process 122. In one example, physical object 102 is a PPAP document, and physical object 106 is a PSW document or a PCN document. For example, the PCN document may specify a change in one or more materials used to build the product. Comparison of the parameters obtained from scanning the encoded images 104, 108 can be used to determine that the PPAP document corresponds to the PCN document so that the change in the material is properly implemented when manufacturing the product in a manufacturing facility that includes manufacturing facility server 116.

In one example, the customer approves the change in the material by providing the PSW document to a supplier after reviewing the PCN document. The PSW document can include an encoded image (not shown) that is scanned by scanner 110 and determined by computing device 112 to correspond to the PPAP document. In addition, computing device 112 can determine from the encoded image of the PSW document that manufacture of the product is authorized by the customer. Computing device 112 can communicate this authorization to manufacturing facility server 116. Further, server 116 can update manufacturing data 114 to reflect the change in the material to be used in manufacturing process 122. In one example, the change of material corresponds to material incorporated into the product by manufacturing machine 118 during manufacture.

In one embodiment, physical object 102 is a PPAP document that corresponds to specifications 124 used to make the product in manufacturing process 122. In one example, the product made is physical product 126. An encoded image 128 can be attached to, integrated with, and/or affixed to physical product 126. The encoded image 128 corresponds to specifications 124. In one example, the encoded image 128 encodes parameters related to processing conditions observed during manufacture on manufacturing machine 118. In another example, a scanner 120 coupled to manufacturing machine 118 scans encoded image 128 to obtain parameters related to the operation of manufacturing machine 118 when making physical product 126. In one example, the obtained parameters control a chemical or other processing condition associated with manufacturing machine 118. In another example, the obtained parameters control a testing process used after manufacturing physical product 126.

In one embodiment, physical product 126 is shipped to a distribution facility having distribution facility server 130. Server 130 scans the encoded image 128 to obtain parameters used to handle logistics for the physical product 126. For example, the obtained parameters can be used to determine how to ship or otherwise provide the physical product 126 to a customer facility having customer facility server 132. In one example, distribution facility server 130 can transmit a communication to customer facility server 132 based on the parameters obtained from scanning encoded image 128. In another example, server 130 can additionally and/or alternatively transmit a communication to computer device 112 regarding data obtained from scanning of encoded image 128.

In one embodiment, physical object 102 is a label affixed to physical product 126 or is a label affixed to a container that holds physical product 126. Computing device 112 can use scanner 110 to scan encoded image 104 during manufacture of product 126.

In another embodiment, physical object 102 is manufacturing machine 118. Encoded image 104 can be scanned during manufacture of product 126. In one example, operation of manufacturing machine 118 can be adjusted or otherwise controlled based on parameters obtained from this scanning.

In one embodiment, computing device 112 prepares a report based on scanning by scanner 110 of encoded images 104 and 108. The report indicates differences between manufacturing requirements that are determined from this scanning. Computing device 112 sends the report over communication network 121 to manufacturing facility server 116 and/or customer facility server 132.

In one embodiment, encoded image 104 includes an identifier. Computing device 112 uses the identifier to look up data regarding physical product 126. For example, the looked up data can be stored as manufacturing data 114.

In one embodiment, encoded image 104 is a QR code. A mobile phone (e.g., computing device 112 can be a mobile phone having scanner 110) with an app is used to scan the QR code to extract the information encoded therein. Two QR codes from two PPAPs can be compared by the mobile app to show the differences and common aspects. Two QR codes from two documents can be compared by the mobile app to determine whether the two documents (e.g., a PPAP and a corresponding PCN) are a match for the development of a product (e.g., product 126). The mobile app can be connected to a server to further link the QR code/PPAP to other information stored in a server (e.g., drawings and diagrams stored in manufacturing data 114). For example, each PPAP can have a unique version identifier that is encoded in the QR code. Thus, the QR code of a PPAP can be used to look up the identification of samples (e.g., samples made per specifications 124 using manufacturing process 122). The QR code has a set of parameters unique to the samples. Any subsequent documents related to the samples can be provided with the same QR code, such that the information can be accessed using a scanner without a need to connect to a server. However, in some cases, a server can be used to provide additional information about the PPAP. The access to the additional information may be privileged (e.g., require authorization and/or authentication). In some instances, a QR code may include a descriptive message specific to a situation associated with manufacturing process 122 and/or customer requirements prior to manufacture.

In one embodiment, physical product 126 is a silicon wafer. Each silicon wafer that is processed using manufacturing process 122 receives a unique laser scribe (e.g., for product traceability). Encoded image 128, and/or another encoded image, includes a parameter corresponding to this laser scribe.

Figure 2:
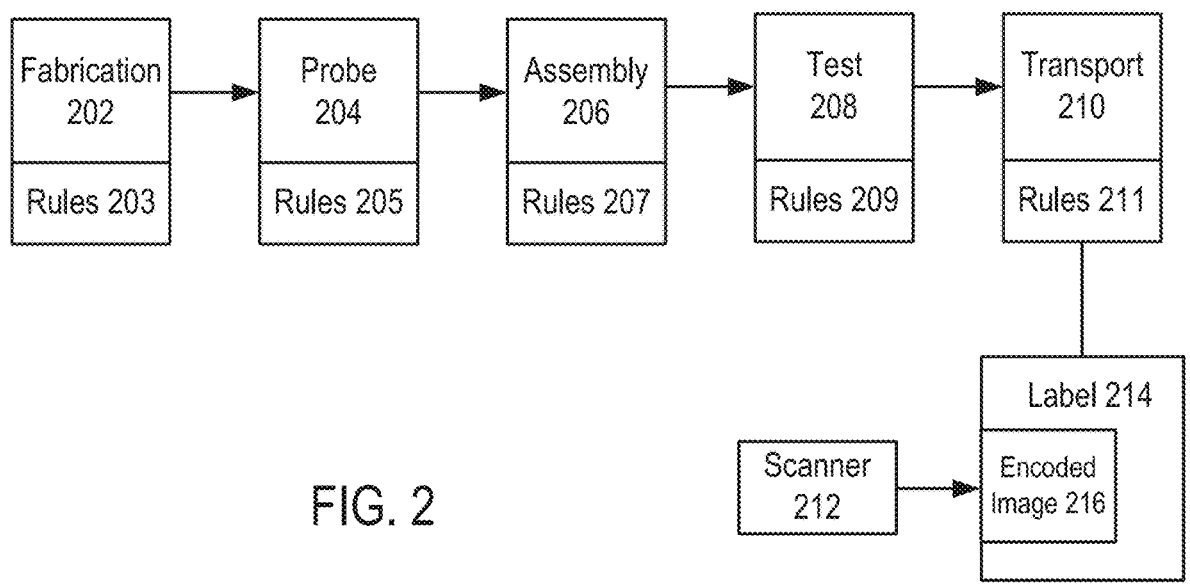
FIG. 2 shows an example of the manufacturing process of FIG. 1, according to one embodiment.

FIG. 2 shows an example of the manufacturing process 122 of FIG. 1, according to one embodiment. Manufacturing process 122 includes manufacturing steps performed in a manufacturing facility (not shown). These steps include fabrication 202, probe 204, assembly 206, test 208, and transport 210. These steps are implemented according to specifications 124. One or more of these steps can include corresponding rules 203, 205, 207, 209, and 211. These rules can customize and/or further constrain manufacturing requirements for a particular product. For example, these rules can be CCR for a particular customer. For example, these rules can specify the versions of products that can be shipped to certain customers.

In one embodiment, at transport step 210 a label 214 is applied to or otherwise accompanies a product made using manufacturing process 122. The label 214 includes encoded image 216, which includes parameters associated with one or more of the manufacturing steps. In another embodiment, encoded image 216 includes one or more parameters corresponding to a logistical transport operation. For example, the parameters can indicate a location of a destination for shipment and/or a location of an origination of shipment for the product. In one example, manufacturing facility server 116 uses scanner 212 to scan encoded image 216. Parameters obtained from this scanning are transmitted over communication network 121 to distribution facility server 130 and/or customer facility server 132.

Figure 3:
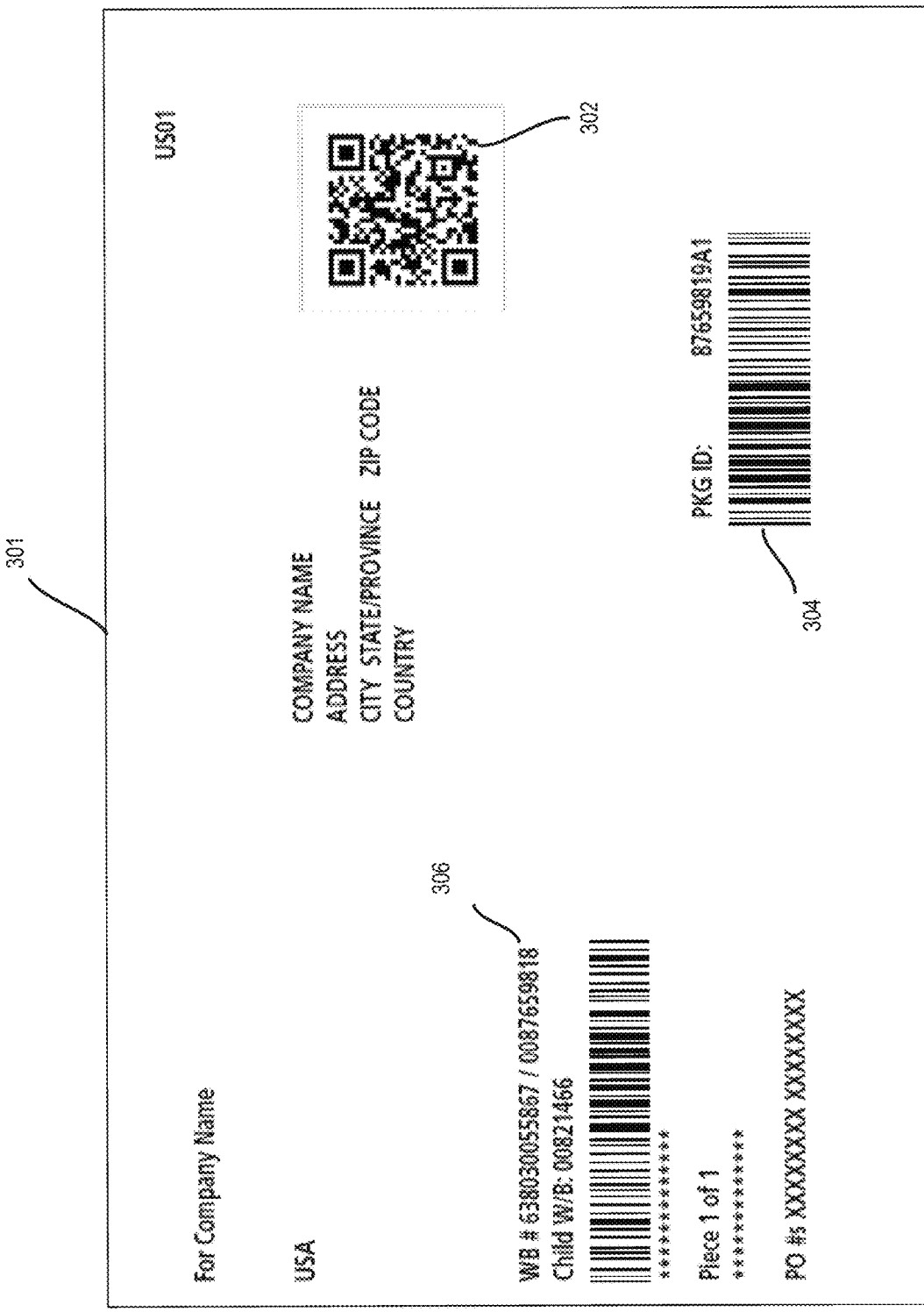
FIG. 3 shows an example label having a QR code on the label, according to one embodiment.

FIG. 3 shows an example label 301 having a QR code 302 on the label 301, according to one embodiment. In addition to QR code 302, label 301 may also include barcode 304. In one example, barcode 304 is a one-dimensional barcode. Label 301 may also further include alphanumeric data 306, which includes alphanumerical characters that are printed on label 301.

In one embodiment, labels (e.g., label 301) used for module production have standard requirements for each line printed on the label, but can vary in type. In one example, a supplier's module label content and format can conform to JEDEC label specifications. The supplier can use various packaging labels to enable faster identification of packaged contents. For example, the supplier's labels use standard barcode labels that conform to EIA Standard 556. The barcode labels enable customers to scan the supplier's containers for faster order verification. In one example, customer facility server 132 uses a scanner to scan encoded image 128. In one example, the use of the QR code on label 301 reduces discrepancies/gaps among DOM, CCR, Inventory, PCN, PSW, and PPAP documents.

In one embodiment, as mentioned above, each PPAP can have a unique version identifier that is encoded in the QR code. Thus, the QR code of a PPAP can be used to look up the identification of samples. The QR code has a set of parameters unique to the samples. Any subsequent documents (e.g., label 301 and/or other shipping document, package, or container) related to the samples is provided with the same QR code, such that the information can be accessed using a scanner without a need to connect to a server.

The addition of QR code 302 to label 301 can provide various advantages. For example, conformance of products and related content to potentially applicable legal, customer and/or internal requirements of the supplier can be improved. Conformity to official requirements from a governing or ruling group (e.g., trade laws) can be improved. Compliance with legal customer requirements relating to product content can be improved. Development, redesign, and/or deployment of a new or existing business process to conform to customer requirements can be made more efficient. Tracking of products shipped to a customer facility can be improved.

Figure 4:
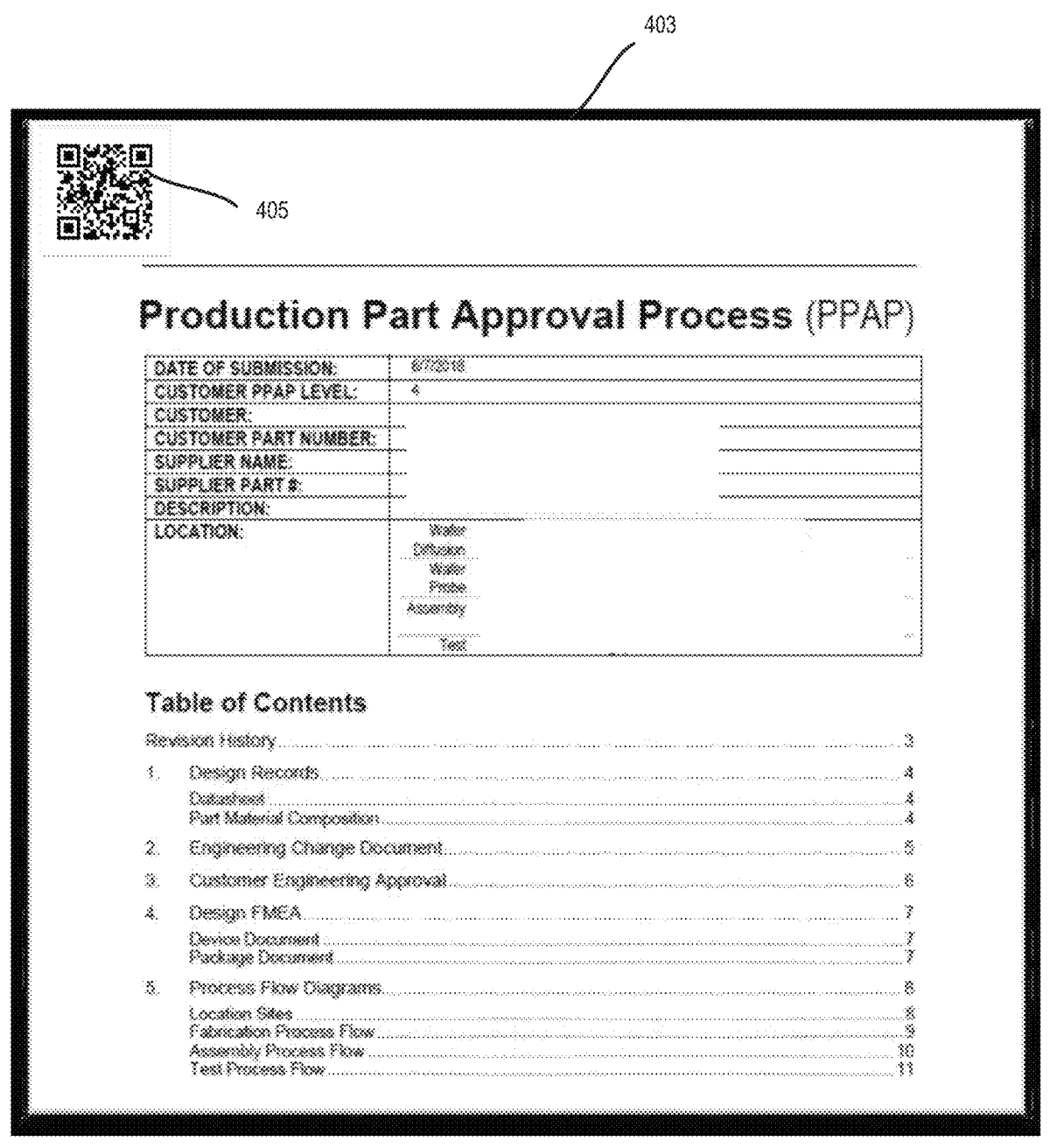

FIG. 4 shows an example Production Part Approval Process (PPAP) document 403 having a QR code 405 on the document, according to one embodiment. In one example, QR code 405 is printed as part of a paper document. In another example, QR code 405 is a label that is attached to a paper or plastic document 403. In one example, QR code 405 corresponds to specifications 124 for manufacturing process 122 of FIG. 1. In other embodiments, QR code 405 can be also included or placed on other documents such as PSW, PCN, BOM, CCR, etc.

FIG. 5 shows an example set of parameter types 502 and corresponding parameter values 504 that can be encoded in a QR code, according to one embodiment. In one example, the QR code is encoded image 104, encoded image 108, and/or encoded image 128. For each of these examples, the QR code encodes parameters that can be later obtained from scanning the encoded image as parameter values for evaluation by a computing device (e.g., computing device 112 or manufacturing facility server 116). In another example, the QR code is encoded image 216.

In one example, parameters 502 include one or more parameters related to materials used in the manufacture of a product. In another example, parameters 502 include one or more parameters related to assembly, testing, and/or location of manufacture.

Figure 6:
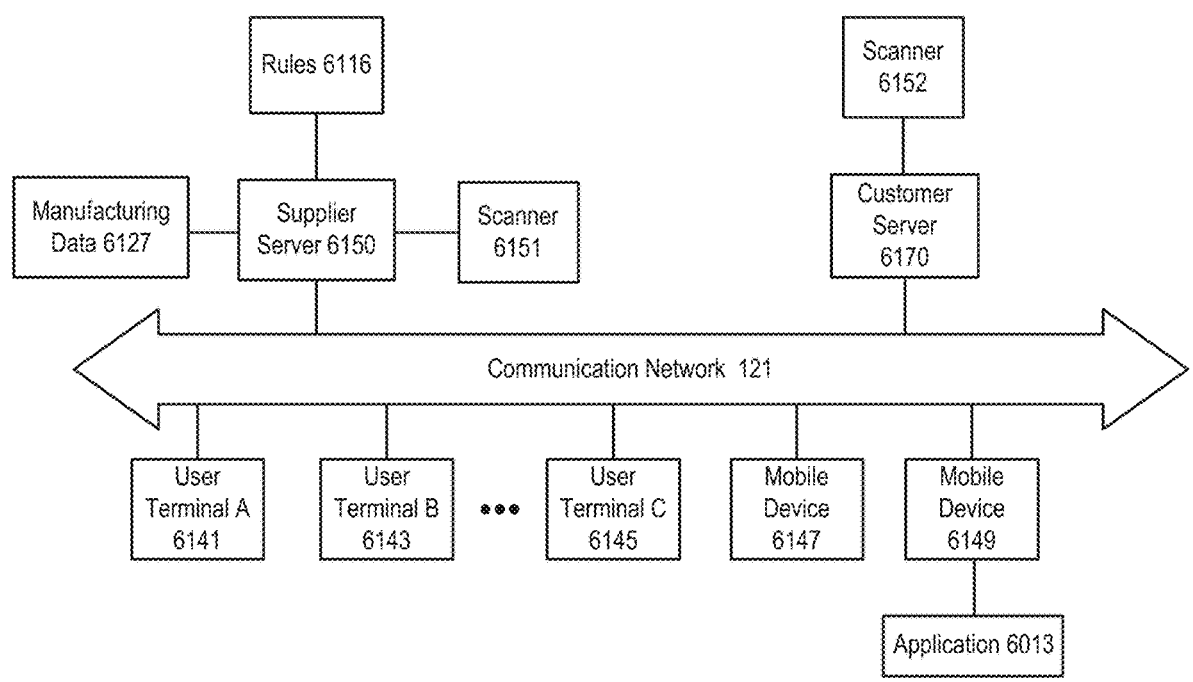
FIG. 6 shows an example computing system for scanning one or more physical objects to determine parameters for a manufacturing process, according to one embodiment.

FIG. 6 shows an example computing system for scanning one or more physical objects to determine parameters for a manufacturing process, according to one embodiment. Supplier server 6150 uses scanner 6151 to scan QR codes that are on physical objects, as described herein. Rules 6116 can include a list of attributes used to ensure that a customer receives the correct product that has been ordered by the customer. In one example, rules 6116 are CCRs.

Customer server 6170 uses scanner 6152 to scan QR codes, as described herein. Customer server 6170 can communicate with supplier server 6150 over communication network 121 based on parameters obtained from this scanning. Similarly, supplier server 6150 can initiate communication with customer server 6170 based on parameters obtained from scanning one or more QR codes.

In one embodiment, supplier server 6150 and/or customer server 6170 can send one or more communications over communication network 121 to mobile device 6147 or 6149 based on parameters obtained from scanning QR codes on one or more physical objects (e.g., a product, label, or PPAP document). In one example, such communications provide data that is displayed to a user of the mobile device regarding a status of a product in a manufacturing process. Communications can also occur with other types of computing devices, such as user terminals 6141, 6143, 6145.

In one embodiment, mobile device 6149 executes an application 6013. Application 6013 can be used to scan QR codes as described herein (e.g., using a camera of mobile device 6149).

In one embodiment, supplier server 6150 stores manufacturing data 6127. In one example, manufacturing data 6127 is manufacturing data 114. Manufacturing data 6127 can be updated in response to one or more parameters obtained using scanner 6151. Manufacturing data 6127 also can be updated in response to a communication received from mobile device 6149 and/or customer server 6170.

In one embodiment, a supplier's automotive customers purchase products such as, for example, memories (e.g., DDR, NAND, eMMC, SSD) through a distributor. Each customer is identified by a customer number, and the product is identified using a Customer Part Number (CPN). This code (CPN) can be used as a link between the supplier code (e.g., supplier part number) and the customer.

The CPN can be inserted into the PPAP document (e.g., using a QR code) as the identification code of the product, and also of the customer's requirements (e.g., shipment location, country, etc.). This can be done for those customers with shipment through the distributor. For these customers, a PPAP for the distributor is prepared and sent to the customer. The shipments of the product are sent to the distributor through the link to the CPN for the distributor, which redirects the product to the distributor.

In some cases, a customer buys through the distributor, and also has requested and approved a PPAP. In these cases, the distributor guarantees that the supplier's products are in compliance with the PPAP approved between the supplier and the customer.

In another embodiment, the distributor re-packs batches of product from the supplier according to a minimum bulk (e.g., in the Tape and Reel box the maximum quantity for reel is 1000 units, while for Dray Pack it is 980 units). In one example, the customer requests an order of 500 units. These 500 units are repackaged in another box (without the supplier's label). Compliance with the PPAP can ensured for all products, including shipments made through the distributor, by using QR codes on documents, packaging, and/or product, as described herein.

In one example, a supplier uses a special label Supplier PPAP. The same label can also be used by the distributor. Use of the Supplier PPAP ensures compliance for the customer.

Figure 7:
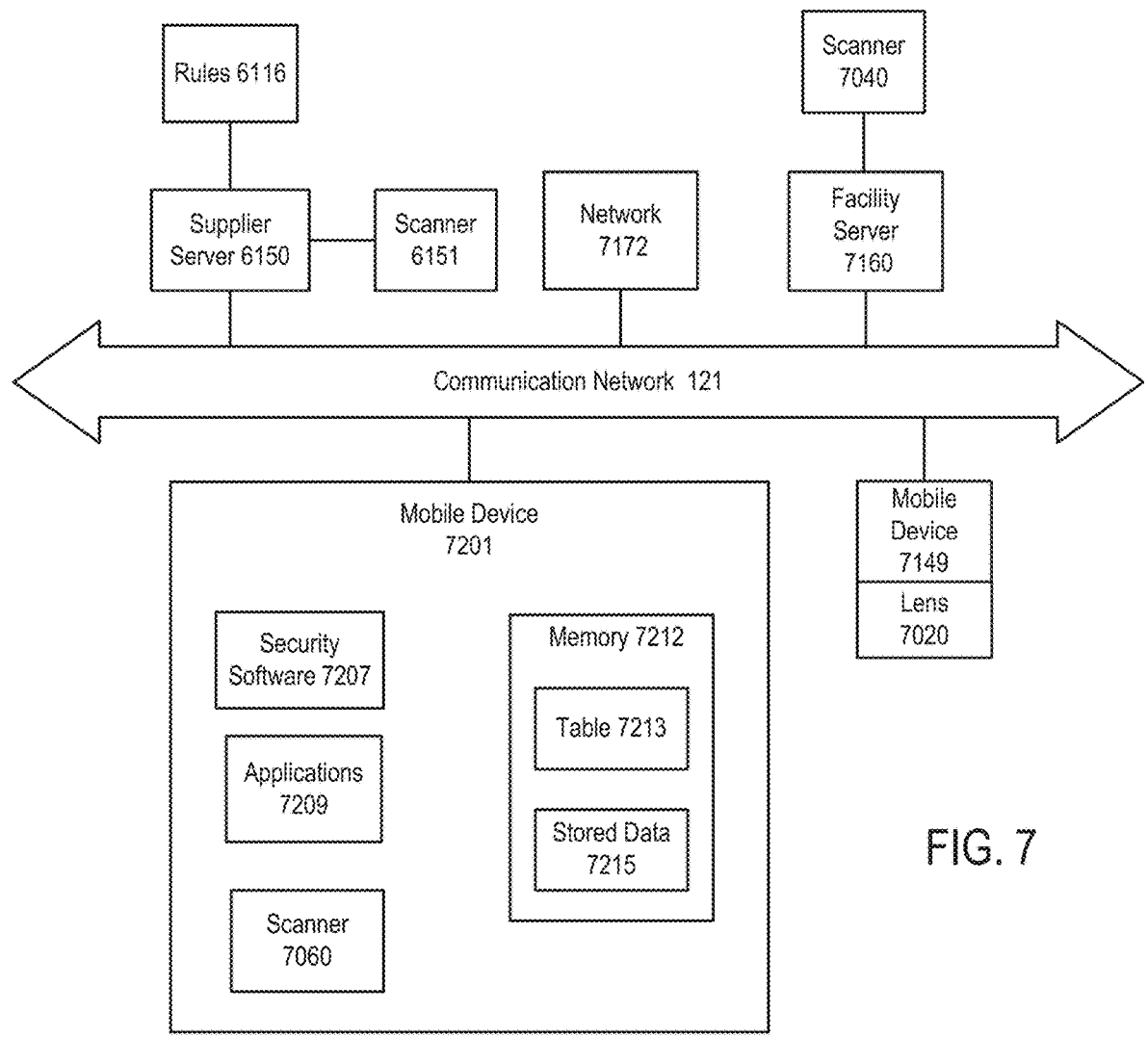
FIG. 7 shows an example computing system in which a mobile device scans a physical object to determine parameters for manufacturing process, according to one embodiment.

FIG. 7 shows an example computing system in which a mobile device 7201 scans a physical object (not shown) to determine parameters for a manufacturing process, according to one embodiment. In one example, the manufacturing process is manufacturing process 122 of FIG. 1.

Mobile device 7201 includes a scanner 7060 that scans an encoded image (not shown) on the physical object. This scanning obtains parameters encoded in the image. In one example, the parameters include values for processing conditions to use when making the product. In another example, the parameters may further include values to use for testing algorithms used to test the product during and/or after manufacture, assembly, and/or packaging. Other examples include values to use for design parameters, and/or parameters to identify materials to use in making the product.

In one embodiment, data obtained from scanning a QR code is stored in the stored data 7215 in memory 7212 of mobile device 7201. One or more of applications 7209 executing on mobile device 7201 can control scanner 7060 during this scanning, and perform various computation and control processes. In one example, stored data 7215 is processed to create table 7213, which includes parameter types and corresponding values for manufacturing process 122.

In one embodiment, mobile device 7201 communicates parameters to supplier server 6150 over communication network 121. Server 6150 requires that mobile device 7201 be authenticated. In one example, mobile device 7201 authenticates itself by accessing a computing device in network 7172, which communicates an authorization to supplier server 6150 after mobile device 7201 has been authenticated. In response to this authentication, supplier server 6150 changes manufacturing data 114 to adjust one or more steps of manufacturing process 122. In one example, security software 7207 controls this authentication process and communication with network 7172 and supplier server 6150.

In one embodiment, facility server 7160 is coupled to scanner 7040, which is used to scan a first QR code on a PPAP or other document. Mobile device 7149 includes a lens 7020 that scans a second QR code on a PPAP or other document. Parameters obtained from scanning the QR codes are compared. Based on this comparison, facility server 7160 and/or mobile device 7149 determines that the PPAP or other documents correspond to manufacturing process 122.

Although FIG. 7 illustrates an exemplary system implemented in client-server architecture, embodiments of the disclosure can be implemented in various alternative architectures. For example, the facility server 7160 may be implemented via a peer to peer network of computing devices in some embodiments, where data/information from computing devices are shared via peer to peer communication connections.

In some embodiments, a combination of client server architecture and peer to peer architecture can be used, in which one or more centralized servers may be used to provide some of the information and/or services and the peer to peer network is used to provide other information and/or services. Thus, embodiments of the disclosure are not limited to a particular architecture.

Figure 8:
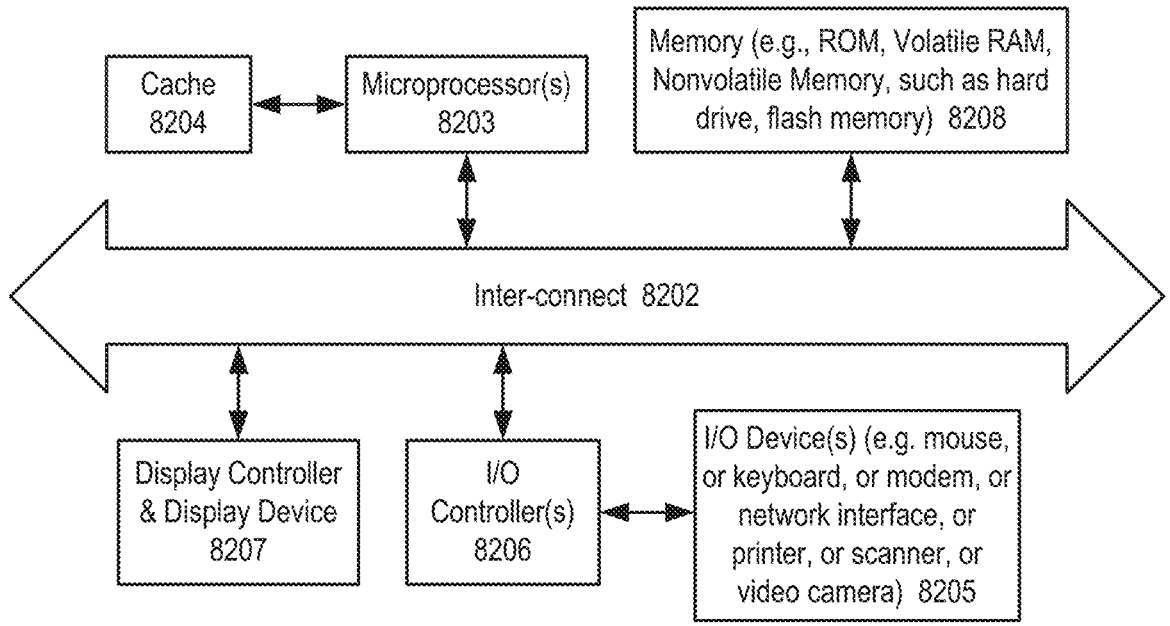
FIG. 8 shows a block diagram of a computing device (e.g., a supplier server, or a customer server), which can be used in various embodiments.

FIG. 8 shows a block diagram of a computing device (e.g., a supplier server 6150, or a customer server 6170), which can be used in various embodiments. While FIG. 8 illustrates various components, it is not intended to represent any particular architecture or manner of interconnecting the components. Other systems that have fewer or more components may also be used. In an embodiment, a supplier server, a customer server, and a distributor server may each reside on separate computing systems, or one or more may run on the same computing device, in various combinations.

In FIG. 8, computing device 8201 includes an inter-connect 8202 (e.g., bus and system core logic), which interconnects a microprocessor(s) 8203 and memory 8208. The microprocessor 8203 is coupled to cache memory 8204 in the example of FIG. 8.

The inter-connect 8202 interconnects the microprocessor(s) 8203 and the memory 8208 together and also interconnects them to a display controller and display device 8207 and to peripheral devices such as input/output (I/O) devices 8205 through an input/output controller(s) 8206. Typical I/O devices include mice, keyboards, modems, network interfaces, printers, scanners, video cameras and other devices which are well known in the art.

The inter-connect 8202 may include one or more buses connected to one another through various bridges, controllers and/or adapters. In one embodiment the I/O controller 8206 includes a USB (Universal Serial Bus) adapter for controlling USB peripherals, and/or an IEEE-1394 bus adapter for controlling IEEE-1394 peripherals.

The memory 8208 may include ROM (Read Only Memory), and volatile RAM (Random Access Memory) and non-volatile memory, such as hard drive, flash memory, etc.

Volatile RAM is typically implemented as dynamic RAM (DRAM) which requires power continually in order to refresh or maintain the data in the memory. Non-volatile memory is typically a solid-state drive, magnetic hard drive, a magnetic optical drive, or an optical drive (e.g., a DVD RAM), or other type of memory system which maintains data even after power is removed from the system. The non-volatile memory may also be a random access memory.

The non-volatile memory can be a local device coupled directly to the rest of the components in the computing device. A non-volatile memory that is remote from the computing device, such as a network storage device coupled to the computing device through a network interface such as a modem or Ethernet interface, can also be used.

In one embodiment, a computing device as illustrated in FIG. 8 is used to implement computing device 112, supplier server 6150, customer server 6170, facility server 7160, and/or other servers.

In another embodiment, a computing device as illustrated in FIG. 8 is used to implement a user terminal or a mobile device on which an application is installed or being installed. A user terminal may be in the form, for example, of a laptop or notebook computer, or a personal desktop computer.

In some embodiments, one or more servers can be replaced with the service of a peer to peer network of a plurality of data processing systems, or a network of distributed computing systems. The peer to peer network, or a distributed computing system, can be collectively viewed as a computing device.

Embodiments of the disclosure can be implemented via the microprocessor(s) 8203 and/or the memory 8208. For example, the functionalities described can be partially implemented via hardware logic in the microprocessor(s) 8203 and partially using the instructions stored in the memory 8208. Some embodiments are implemented using the microprocessor(s) 8203 without additional instructions stored in the memory 8208. Some embodiments are implemented using the instructions stored in the memory 8208 for execution by one or more general purpose microprocessor(s) 8203. Thus, the disclosure is not limited to a specific configuration of hardware and/or software.

Figure 9:
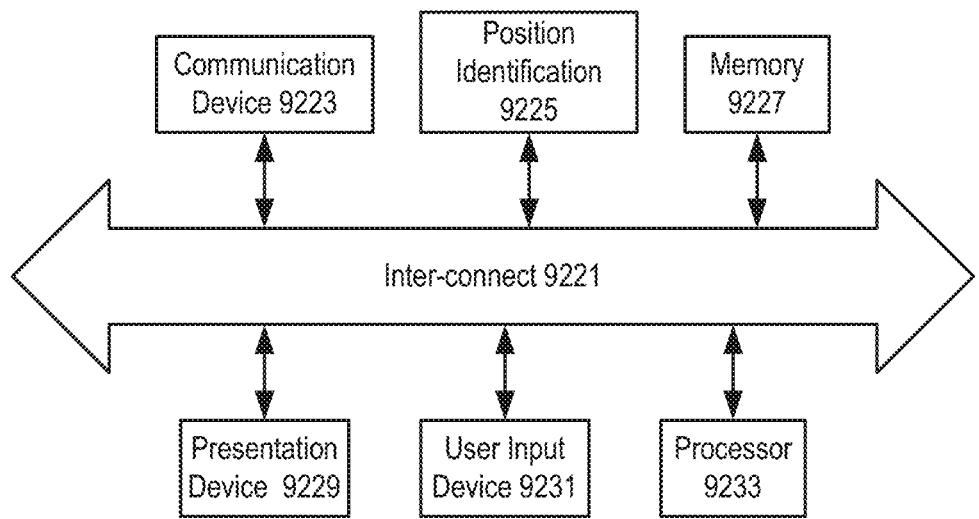
FIG. 9 shows a block diagram of a computing device (e.g., a mobile device of a user, or a user terminal), according to one embodiment.

FIG. 9 shows a block diagram of a computing device (e.g., a mobile device of a user, or a user terminal), according to one embodiment. In FIG. 9, the computing device includes an inter-connect 9221 connecting the presentation device 9229, user input device 9231, a processor 9233, a memory 9227, a position identification unit 9225 and a communication device 9223.

In FIG. 9, the position identification unit 9225 is used to identify a geographic location. The position identification unit 9225 may include a satellite positioning system receiver, such as a Global Positioning System (GPS) receiver, to automatically identify the current position of the computing device.

In FIG. 9, the communication device 9223 is configured to communicate with a server to provide data, including parameter data (e.g., values for manufacturing specifications obtained from a QR code). In one embodiment, the user input device 9231 is configured to receive or generate user data or content. The user input device 9231 may include a text input device, a still image camera, a video camera, and/or a sound recorder, etc.

Figure 10:
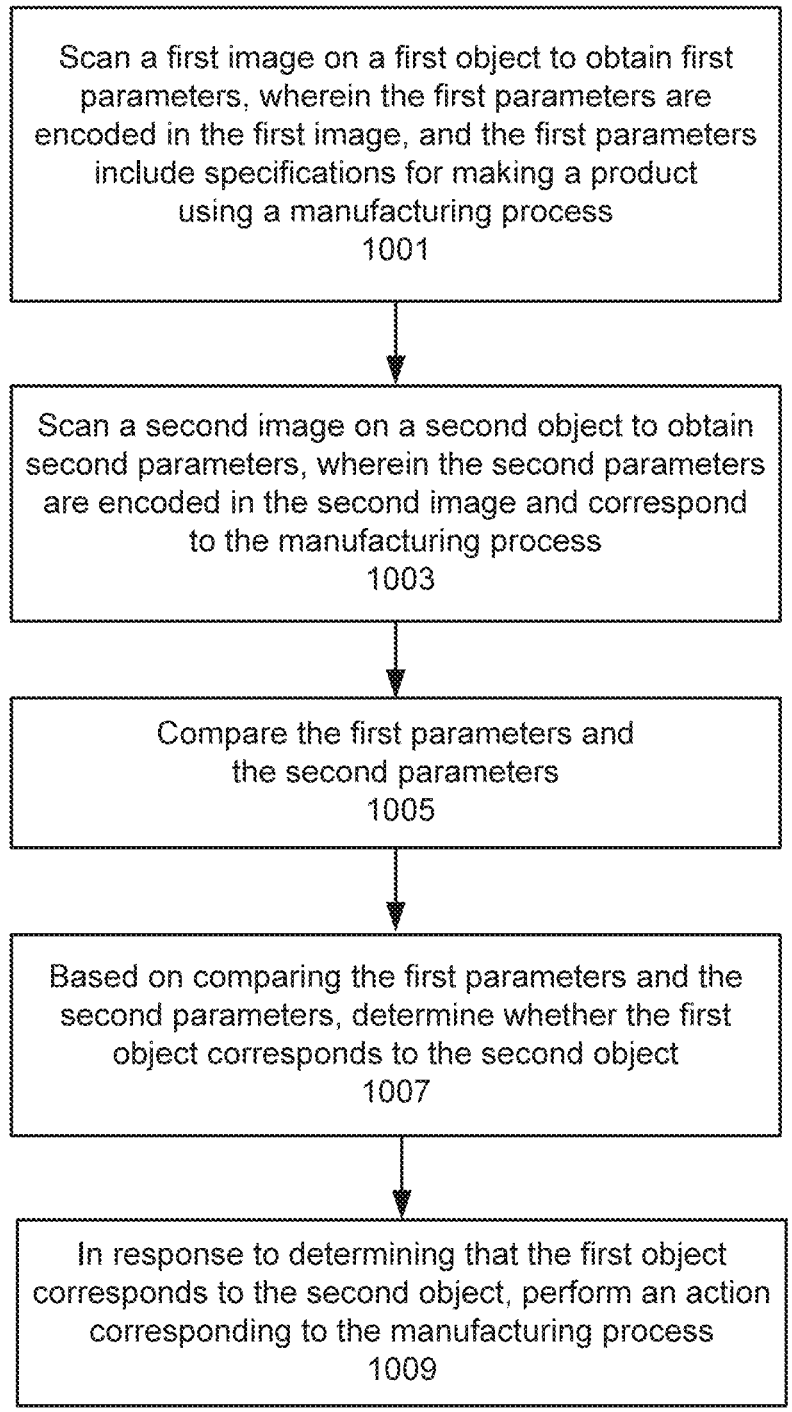
FIG. 10 shows a method for scanning encoded images on physical objects to determine parameters for a manufacturing process, according to one embodiment.

FIG. 10 shows a method for scanning encoded images on physical objects to determine parameters for a manufacturing process, according to one embodiment. For example, the method of FIG. 10 can be implemented in the system of FIGS. 1, 6, and 7.

The method of FIG. 10 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof.

In some embodiments, the method of FIG. 10 is performed at least in part by one or more processors of supplier server 6150 of FIG. 6. In one embodiment, supplier server 6150 is implemented using the processors and memory of FIG. 8 or 9.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1001, a first image on a first object is scanned to obtain first parameters. The first parameters are encoded in the first image. The first parameters include specifications for making a product using a manufacturing process. In one example, the first image is a QR code, and the first object is a PPAP or other document.

At block 1003, a second image on a second object is scanned to obtain second parameters. The second parameters are encoded in the second image and correspond to the manufacturing process. In one example, the second image is a QR code, and the second object is a PSW, PCN, or other document.

At block 1005, the first parameters and the second parameters are compared. In one example, values for manufacturing specifications obtained from the first and second parameters are compared. In one example, computing device 112 and/or manufacturing facility server 116 performs the comparison.

At block 1007, based on comparing the first parameters and the second parameters, it is determined whether the first object corresponds to the second object. In one example, supplier server 6150 determines that an approval associated with a PSW document corresponds to a PPAP document. In one example, the PPAP document includes specifications 124 for manufacturing process 122 of FIG. 1.

At block 1009, in response to determining that the first object corresponds to the second object, an action is performed that corresponds to the manufacturing process. In one example, manufacturing facility server 116 updates manufacturing data 114. In one example, server 116 authorizes production of a product using manufacturing process 122. In one example, server 116 sends a communication regarding the scanned parameters over a communication network 121 to customer facility server 132.

In one embodiment, a method comprises: scanning a first image (e.g., encoded image 104) on a first object (e.g., physical object 102) to obtain first parameters (e.g., parameter types 502 and/or values 504), wherein the first parameters are encoded in the first image, the first parameters comprise specifications for making a product using a manufacturing process (e.g., manufacturing process 122), the specifications include at least one material used to build the product, and the manufacturing process comprises manufacturing steps performed in a manufacturing facility; scanning a second image (e.g., encoded image 108) on a second object (e.g., physical object 106) to obtain second parameters, wherein the second parameters are encoded in the second image, at least one of the second parameters corresponds to a first step of the manufacturing steps, and the first step uses the at least one material; comparing, by a computing device (e.g., computing device 112), the first parameters and the second parameters; based on comparing the first parameters and the second parameters, determining, by the computing device, whether the first object corresponds to the second object; and in response to determining that the first object corresponds to the second object, performing an action corresponding to the manufacturing process.

In one embodiment, the first image is a two-dimensional barcode; the second image is a two-dimensional barcode; the first object is a document that includes the specifications for making the product; the second object is a document that includes revisions to the specifications; and the action comprises updating the specifications based on comparing the first parameters and the second parameters, and making the product using the updated specifications.

In one embodiment, the first image comprises alphanumerical characters, the first object is a label, and the alphanumerical characters are printed on the label.

In one embodiment, the first object is: a paper or plastic document (e.g., PPAP document 403); a card; a label affixed to the product made by the manufacturing process; a label affixed to a container that holds the product made by the manufacturing process; a machine used in the manufacturing process; or a package for the product made by the manufacturing process, wherein the first image is engraved on the package.

In one embodiment, the action comprises printing a label (e.g., label 301), and the label is associated with the product made by the manufacturing process.

In one embodiment, the action comprises making the product using the manufacturing process, and the method further comprises: attaching a third image to the product, the third image encoding third parameters that correspond to the specifications for making the product.

In one embodiment, the specifications for making the product comprise at least one of: chemical processing conditions for making the product; testing processes for testing the product; design parameters for the product; or materials used to build the product.

In one embodiment, a scanner is used to scan the first image, and the scanner is: a camera configured to scan barcodes; a mobile device including a lens used to scan the first image, the mobile device executing software to decode the first image to obtain the first parameters; or a barcode reader.

In one embodiment, the first image is a two-dimensional barcode, the product is a memory device; the first object is a document that includes the specifications for making the memory device using the manufacturing process; the second object is a document that approves the specifications for making the memory device; and the action comprises sending, to another computing device, an authorization to make the memory device.

In one embodiment, the computing device is a mobile device (e.g., mobile device 7201), the first parameters further comprise a link, and a server (e.g., manufacturing facility server 116) stores data associated with the manufacturing process. The method further comprises accessing, by the mobile device, the stored data (e.g., manufacturing data 114, or manufacturing data 6127) using the link.

In one embodiment, the first object is a production part approval process (PPAP) document that specifies manufacturing requirements for making the product; the second object is a part submission warrant (PSW) document approving the product, or is a product change notification (PCN) document that updates the manufacturing requirements for the product; determining that the first object corresponds to the second object comprises determining that the PSW document authorizes manufacture of the product as specified in the PPAP document, or determining that the PCN document updates the manufacturing requirements; and the action comprises making the product in accordance with the manufacturing requirements specified in the PPAP document, or in accordance with the updated manufacturing requirements.

In one embodiment, the PPAP document is provided by a supplier to a customer, the PSW document is received by the supplier from the customer in response to the PPAP document, and the product is made by the supplier.

In one embodiment, the action comprises generating a report that indicates differences between first manufacturing requirements for the manufacturing process encoded by the first parameters and second manufacturing requirements for the manufacturing process encoded by the second parameters.

In one embodiment, the first image encodes an identifier, and the method further comprises looking up, using the identifier, data regarding the product made using the manufacturing process.

In one embodiment, determining that the first object corresponds to the second object comprises correlating the first image with the second image, and the action comprises displaying, in a user interface of a mobile device, the specifications for making the product.

In one embodiment, determining that the first object corresponds to the second object comprises determining that a production part approval process (PPAP) document matches at least one of a part submission warrant (PSW) document or a product change notification (PCN) document.

In one embodiment, the first parameters further comprise one or more processing, product, or test characteristics observed during manufacture of the product made using the manufacturing process, and the method further comprises affixing the first image to at least one of the product, a container or package containing the product, or a document shipped with the product.

In one embodiment, the first parameters further comprise at least one of: an identifier for a material used in the manufacturing process; an identifier for an entity that makes the product using the manufacturing process; an identifier for a physical facility to receive the product made using the manufacturing process; an identifier that identifies the product made using the manufacturing process; a measurement associated with the manufacturing process; a size of a component of the product; a size of a manufacturing device associated with one of the manufacturing steps; a link to a server that stores data associated with the manufacturing process, wherein the stored data comprises drawings, figures, graphics, or diagrams regarding the product made using the manufacturing process; a link to a server that stores data associated with the manufacturing process for access by a computing device using the link, wherein access to the stored data requires authentication of the computing device; or a location of the manufacturing facility.

In one embodiment, a system comprises: at least one processing device; and memory containing instructions configured to instruct the at least one processing device to: scan a first image on a first object to obtain first parameters, wherein the first parameters are encoded in the first image, the first parameters comprise specifications for making a product using a manufacturing process, and the manufacturing process comprises manufacturing steps performed in a manufacturing facility; scan a second image on a second object to obtain second parameters, wherein the second parameters are encoded in the second image, and at least one of the second parameters corresponds to at least one of the manufacturing steps; compare the first parameters and the second parameters; based on comparing the first parameters and the second parameters, determine whether the first object corresponds to the second object; and in response to determining that the first object corresponds to the second object, perform an action corresponding to the manufacturing process.

In one embodiment, a non-transitory computer storage medium stores instructions which, when executed on a computing device, cause the computing device to at least: scan a first image on a first object to obtain first parameters, wherein the first parameters are encoded in the first image, the first parameters comprise specifications for making a product using a manufacturing process, and the manufacturing process comprises manufacturing steps performed in a manufacturing facility; scan a second image on a second object to obtain second parameters, wherein the second parameters are encoded in the second image, and at least one of the second parameters corresponds to at least one of the manufacturing steps; compare the first parameters and the second parameters; based on comparing the first parameters and the second parameters, determine whether the first object corresponds to the second object; and in response to determining that the first object corresponds to the second object, perform an action corresponding to the manufacturing process.

Using Encoded Images to Trace Specifications for a Manufacturing Process

Various embodiments related to using encoded images on physical objects to trace specifications for a manufacturing process are now described below. The generality of the following description is not limited by the various embodiments described above.

For purposes of illustration, various exemplary embodiments are described below in the context of a vehicle manufacturer. However, the methods and systems of the present disclosure are not limited to use in a vehicle manufacturing process. Instead, other embodiments may relate to the manufacture of products for other types of systems (e.g., cloud storage systems, security hardware, etc.).

In one example, the encoded images are QR codes on physical objects (e.g., physical components, printed documents, and/or labels). In one example, the manufacturing process is silicon wafer processing for making a memory device for an autonomous automobile.

In one example of a manufacturing process, a vehicle manufacturer specifies the parameters of a flash memory device, prints the specifications out on a paper document (e.g., a PPAP document that is often over 100 pages in length and difficult for a human to manually review in paper form), and sends it to a supplier of the flash memory device. The supplier does a manual, human review of the paper document, and makes a batch of sample flash memory devices. Then, the supplier sends the samples to the vehicle manufacturer with a printed deck of paper certifying that these samples are made using certain specified parameters (e.g., including some or all specifications as originally sent by the vehicle manufacturer to the supplier in a PPAP document). If the vehicle manufacturer accepts the samples (e.g., by sending an electronic or paper-based authorization to the supplier to manufacture the flash memory device), the supplier can proceed to make a quantity of flash memory devices, and then ship them to the vehicle manufacturer.

The manufacturing process described above is a simple case. In other cases, various technical problems arise when revisions are made to the specifications by the supplier and/or the vehicle manufacturer. For example, the vehicle manufacturer may reject the samples and request that one or more specifications be changed. It is difficult for a human to manually review and compare printed documents to identify changes in particular specifications. As a result, technical errors may frequently occur due to human error in reviewing such printed documents.

In one example, the vehicle manufacturer's requested specifications may conflict with the supplier's manufacturing process (e.g., the supplier's silicon wafer processing, assembly, packaging, or testing machines may not be able to meet the specifications requested by the vehicle manufacturer). The supplier sends revisions, and the vehicle manufacturer may send revisions on revisions. In another case, the production line of the supplier may change, which may have an impact on a previously-approved specification (and thus require revisions be communicated between the supplier and the vehicle manufacturer). In another example, different vehicles or vehicle models of the vehicle manufacturer can have different specifications. In one example, orders from different vehicle manufacturers may have specification overlaps and differences. Also, there may be further complications as to what products can be shipped to particular countries (e.g., due to export restrictions). Managing all these changes through manual reading of paper can be inefficient, and lead to errors in manufacturing of products.

Various embodiments described below provide a technological solution to one or more of the above technical problems. In some embodiments, QR codes can be used to improve the review and comparison of specifications in PPAP, PSW, PCN, EOL, CCR and/or BOM printed documents. In one embodiment, each printed document associated with a manufacturing process includes a QR code placed on the printed document (e.g., a QR code in a label placed on a document, or a QR code printed in the document itself).

Using the QR codes on the printed documents can simplify manual review of specifications and revisions to specifications that are included in the documents. In a simple case, the same QR code can be placed on each printed document. By scanning the QR code on each document when received from a vehicle manufacturer or a supplier, the document can be determined to correspond to other documents in possession of the human reviewer. In one example, the reviewer can scan the QR code using a camera of a mobile device.

In other cases, the QR code placed on each printed document can be different. However, the QR code includes a common set of parameters that are the same in each of the QR codes. Thus, a human reviewer can scan a QR code on first printed document being reviewed to obtain parameters that include the common set of parameters. The reviewer can scan a QR code on a second printed document being reviewed to obtain parameters that also include the same common set of parameters. Thus, in this manner, the reviewer can determine that the first printed document corresponds to the second printed document. Further, parameters obtained from the QR codes can be used to correlate each printed document to a manufacturing process.

In many cases, a QR code cannot encode all specifications or other data of interest for a particular manufacturing process due to data size limitations of the QR code. Thus, a limited number of data items is selected for encoding. In one example, these encoded data items can be the common set of parameters mentioned above, to be included in all QR codes that correspond to a manufacturing process and/or to a set of printed documents associated with the manufacturing process. In another example, these encoded data items can be links that point to stored data (e.g., data stored in a database on manufacturing facility server 116). In another example, these encoded data items can include unique identifiers (e.g., an alphanumeric value) that identify, for example, a manufacturing process, a product, a sample, etc. The unique identifier can be read by scanning the QR code, then used to search for stored data (e.g., data stored in a database on manufacturing facility server 116).

In one embodiment, a vehicle manufacturer creates specifications for a product and includes the specifications in a PPAP document that is provided to a supplier. The PPAP document includes a QR code that corresponds to the specifications. In one example, the QR code is attached to the PPAP document as a label. In another example, the QR code is printed on the paper document along with other text and figures.

In one embodiment, the QR code itself is generated by either the supplier or the vehicle manufacturer. If the supplier generates the QR code, the supplier can send the QR code to the vehicle manufacturer by electronic communication over communication network 121. If the vehicle manufacturer generates the secure code, the vehicle manufacturer can send the QR code to the supplier by electronic communication over communication network 121.

In one embodiment, scanning of QR codes on various documents is performed. In order to determine if two documents correspond to one another, it is determined whether there is a partial match of parameter sets. For example, a correspondence rule may be established that requires that a set of predetermined parameters (e.g., the common set of parameter above) be identical in order to determine that two documents are corresponding.

Figure 11:
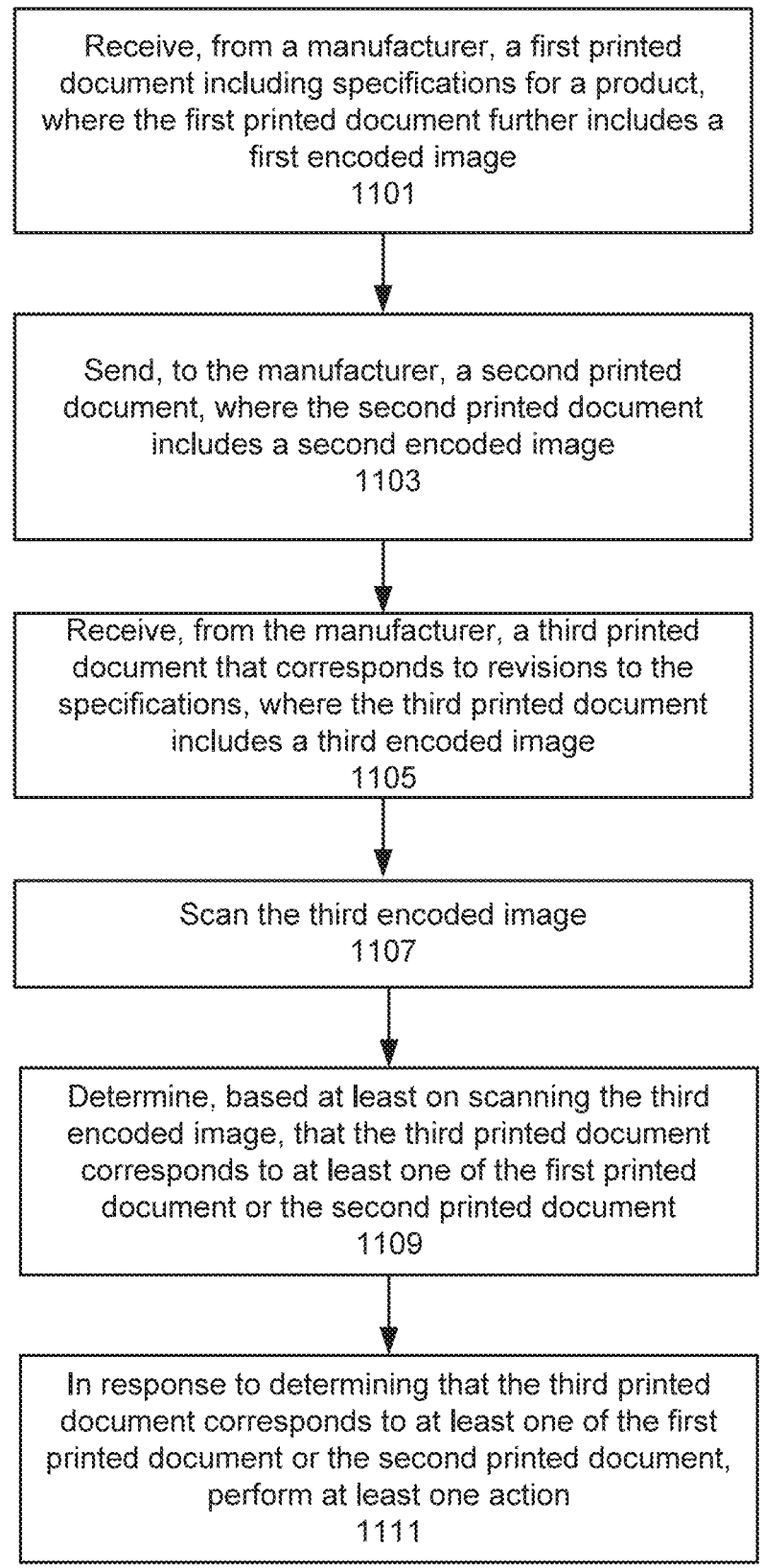
FIG. 11 shows a method for using encoded images on physical objects to trace specifications for a manufacturing process, according to one embodiment.

FIG. 11 shows a method for using encoded images on physical objects to trace specifications for a manufacturing process, according to one embodiment. For example, the method of FIG. 11 can be implemented in the system of FIGS. 1, 6, and 7.

The method of FIG. 11 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof.

In some embodiments, the method of FIG. 11 is performed at least in part by one or more processors of supplier server 6150 of FIG. 6. In one embodiment, supplier server 6150 is implemented using the processors and memory of FIG. 8 or 9.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1101, a first printed document is received from a manufacturer. The first printed document includes specifications for making a product using a manufacturing process and includes a first encoded image. In one example, the first printed document is PPAP document 403. In one example, the encoded image is QR code 405. In one example, the manufacturer is a vehicle manufacturer.

At block 1103, a second printed document is sent to the manufacturer. The second printed document includes a second encoded image. In one example, the second encoded image is a QR code. In one example, the first encoded image and the second encoded image are identical. In one example, the first encoded image and second encoded image each contain a same common set of parameters. In one example, the second printed document is a PSW or PCN document.

At block 1105, a third printed document is received from the manufacturer. The third printed document corresponds to revisions to the specifications and includes a third encoded image. In one example, the third encoded image is identical to the first encoded image and/or the second encoded image. In one example, the third encoded image contains the same common set of parameters above. In one example, the third printed document includes an approval to a PSW and/or PCN document.

At block 1107, the third encoded image is scanned. In one example, the third encoded image is a QR code. In one example, one or more parameters obtained from scanning the third encoded image are compared to parameters obtained from scanning one or more other encoded images, and/or an identifier or other data stored in a database.

At block 1109, based at least on scanning the third encoded image, it is determined that the third printed document corresponds to at least one of the first printed document or the second printed document. In one example, it is determined that the third encoded image contains the same common set of parameters as a QR code on another document associated with the manufacturing process for the product.

At block 1111, in response to determining that the third printed document corresponds to at least one of the first printed document or the second printed document, at least one action is performed. In one example, the action is the manufacture of the product according to the specifications. In other examples, the action can be one or more actions as described above for block 1009 of FIG. 10.

In one embodiment, a method comprises: receiving, from a vehicle manufacturer, a first printed document (e.g., a PPAP document) including specifications for a product (e.g., a memory device) to be integrated into a vehicle, wherein the first printed document further includes a first encoded image, the first encoded image including first parameters (e.g., the common set of parameters encoded in a QR code as described above); manufacturing, based on the specifications, a sample of the product; sending, to the vehicle manufacturer, the sample with a second printed document (e.g., a PSW document) indicating that the sample was made using the specifications, wherein the second printed document includes a second encoded image, the second encoded image including the first parameters; receiving, from the vehicle manufacturer, a third printed document that corresponds to revisions to the specifications, wherein the third printed document includes a third encoded image, the third encoded image including the first parameters; scanning, by at least one computing device (e.g., a mobile device), the third encoded image; determining, by the at least one computing device and based at least on scanning the third encoded image, that the third printed document corresponds to at least one of the first printed document or the second printed document; and in response to determining that the third printed document corresponds to at least one of the first printed document or the second printed document, manufacturing the product according to the revisions to the specifications.

In one example, the third printed document includes revisions to processing conditions, assembly or packaging requirements, and/or testing requirements. In one example, the third printed document includes an approval for revisions to specifications. In one example, the approval is for revisions to specifications requested by the supplier in a PCN document.

In one embodiment, the first encoded image is generated by the at least one computing device (e.g., manufacturing facility server 116), or by a computing device of the vehicle manufacturer (e.g., customer facility server 132).

In one embodiment, the revisions to the specifications are first revisions, and the method further comprises sending, to the vehicle manufacturer in response to receiving the third printed document, a fourth printed document including second revisions to the specifications, wherein the fourth printed document further includes a fourth encoded image, the fourth encoded image including the first parameters.

In one embodiment, the first printed document is a production part approval process (PPAP) document, and the method further comprises: printing an updated PPAP document that includes the revisions to the specifications, wherein the updated PPAP document includes a fourth encoded image, the fourth encoded image including the first parameters; sending, to the vehicle manufacturer, the updated PPAP document.

In one embodiment, the revisions are first revisions, and the first printed document is a production part approval process (PPAP) document. The method further comprises: sending, to the vehicle manufacturer, a printed product change notification (PCN) document that includes second revisions to the specifications; receiving, from the vehicle manufacturer, an approval of the PCN document; in response to receiving the approval of the PCN document, sending, to the vehicle manufacturer, an updated production part approval process (PPAP) document that includes the second revisions, wherein the updated PPAP document includes a fourth encoded image, the fourth encoded image including the first parameters.

In one embodiment, the method further comprises: scanning the first encoded image; comparing parameters obtained from scanning the first and third encoded images; and based on comparing the parameters, generate a report indicating at least one parameter that differs from the first parameters.

In one embodiment, the method further comprises at least one of displaying the report in a user interface of a mobile device, or sending the report to the vehicle manufacturer (e.g., sending a communication via communication network 121).

In one embodiment, the method further comprises scanning the first encoded image or the second encoded image, and determining that the third printed document corresponds to at least one of the first printed document or the second printed document comprises: determining from scanning the third encoded image that the third encoded image includes the first parameters; and determining from scanning the first encoded image that the first encoded image includes the first parameters, or determining from scanning the second encoded image that the second encoded image includes the first parameters.

In one embodiment, the first parameters uniquely correspond to at least one of: a sample made according to the specifications or the revisions to the specifications; or a printed production part approval process (PPAP) document that corresponds to the specifications or the revisions to the specifications.

In one embodiment, the first parameters include parameters regarding at least one of type of package, mold compound type, wire bond material, leadframe material, substrate material, or thermal resistance.

In one embodiment, the first parameters include a manufacturer part number of the product, and a description of the product.

In one embodiment, scanning the third encoded image comprises obtaining a link, and the method further comprises accessing, using the link, stored data associated with the specifications.

In one embodiment, the stored data comprises drawings or diagrams of the product.

In one embodiment, the stored data is accessed by a mobile device, and the method further comprises displaying at least a portion of the stored data in a user interface of the mobile device.

In one embodiment, the method further comprises: scanning the first or second encoded image, wherein scanning the first or second encoded image provides a unique version identifier associated with the sample; and identifying stored data associated with the sample using the unique version identifier.

In one embodiment, the method further comprises: sending the first printed document to a subcontractor that supplies a component used to manufacture the product; receiving a fourth printed document from the subcontractor that accompanies the component, the fourth printed document including a fourth encoded image that includes the first parameters; scanning the fourth encoded image to obtain the first parameters; and based on the first parameters obtained from scanning the fourth encoded image, authorizing use of the component in manufacturing the product.

In one embodiment, the method further comprises: generating a fourth printed document including a fourth encoded image that includes the first parameters; sending the fourth printed document to a distributor facility; and shipping the manufactured product to the distributor facility; wherein: the fourth encoded image is scanned at the distributor facility; the product is shipped, based on scanning the fourth encoded image at the distributor facility, to the vehicle manufacturer; the vehicle manufacturer scans the fourth encoded image to confirm authenticity of the product; and in response to confirming the authenticity of the product, the vehicle manufacturer integrates the product into the vehicle.

In one embodiment, a system comprises: at least one processing device (e.g., manufacturing facility server 116); and memory containing instructions configured to instruct the at least one processing device to: receive, from a manufacturer, a first printed document including specifications for a product, wherein the first printed document further includes a first encoded image, the first encoded image including first parameters; send, to the manufacturer, a second printed document, wherein the second printed document includes a second encoded image, the second encoded image including the first parameters; receive, from the manufacturer, a third printed document that corresponds to revisions to the specifications, wherein the third printed document includes a third encoded image, the third encoded image including the first parameters; scan the third encoded image; determine, based at least on scanning the third encoded image, that the third printed document corresponds to at least one of the first printed document or the second printed document; and in response to determining that the third printed document corresponds to at least one of the first printed document or the second printed document, perform at least one action associated with the specifications.

In one embodiment, determining that the third printed document corresponds to at least one of the first printed document or the second printed document comprises comparing parameters obtained from scanning the third encoded image to parameters obtained from scanning the first or second encoded image.

In one embodiment, a non-transitory computer storage medium stores instructions which, when executed on a computing device, cause the computing device to at least: receive, from a manufacturer, a first printed document including specifications for a first product to be integrated as a component into another product, wherein the first printed document further includes a first encoded image, the first encoded image including first parameters; send, to the manufacturer, a second printed document, wherein the second printed document includes a second encoded image, the second encoded image including the first parameters; receive, from the manufacturer, a third printed document that corresponds to revisions to the specifications, wherein the third printed document includes a third encoded image, the third encoded image including the first parameters; scan the third encoded image; determine, based at least on scanning the third encoded image, that the third printed document corresponds to at least one of the first printed document or the second printed document; and in response to determining that the third printed document corresponds to at least one of the first printed document or the second printed document, manufacture the first product according to the revisions to the specifications.

Figure 12:
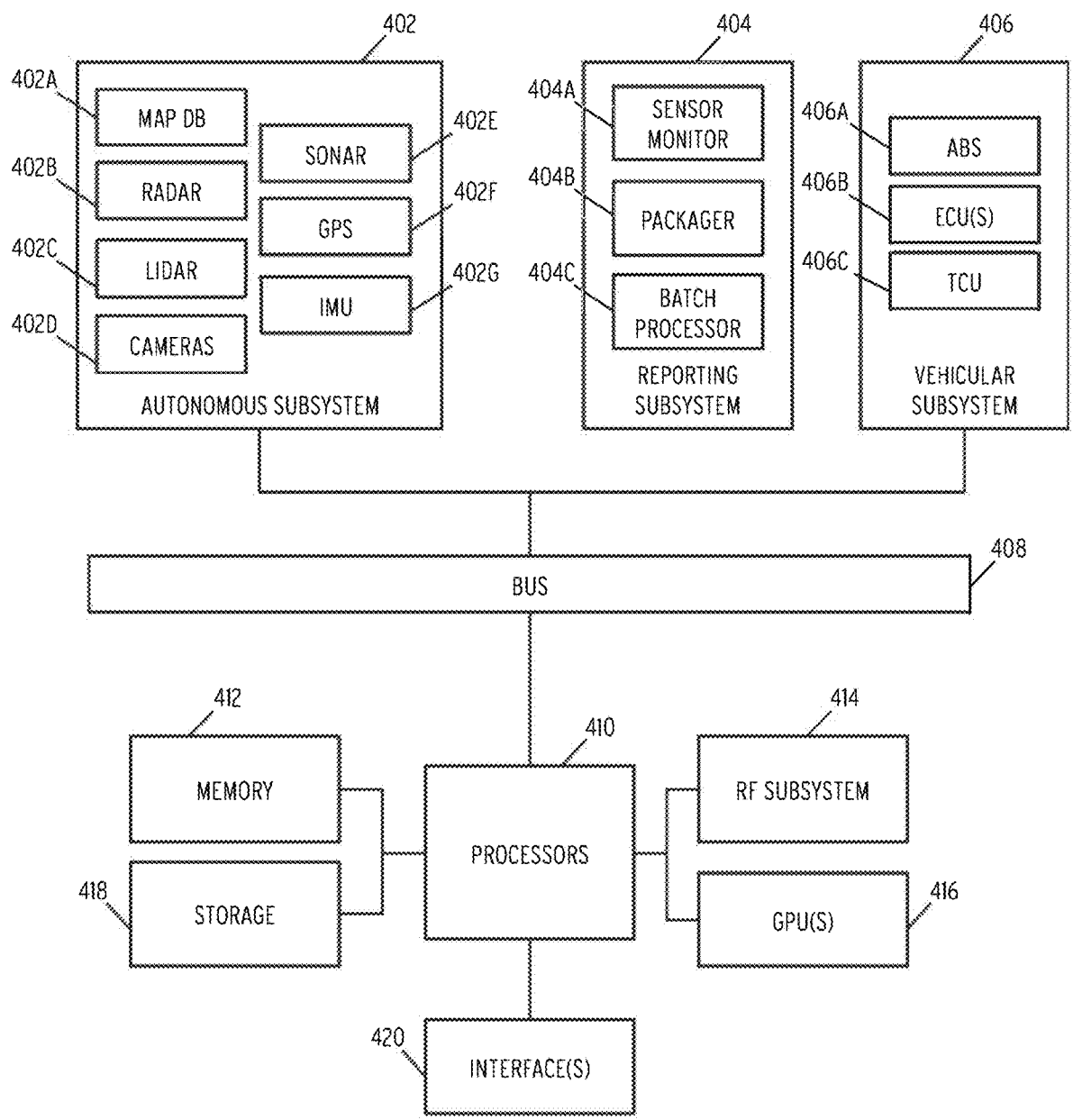
FIG. 12 is a block diagram of an autonomous vehicle including one or more various components and/or subsystems, each of which can be updated in various embodiments to configure the vehicle and/or perform other actions associated with the vehicle.

FIG. 12 is a block diagram of an autonomous vehicle including one or more various components and/or subsystems, each of which can be updated in various embodiments to control navigation based at least in part on received object data, configure the vehicle, and/or perform other actions associated with the vehicle. The system illustrated in FIG. 12 may be installed entirely within a vehicle. In one example, the autonomous vehicle is manufactured by a vehicle manufacturer by integrating a memory device or other product obtained from a memory device or other supplier. In one example, the memory device is memory 412 in FIG. 12. In one example, the memory device or other product for the autonomous vehicle of FIG. 12 represents a product as described for FIGS. 10 and 11 above.

The system includes an autonomous vehicle subsystem 402. In the illustrated embodiment, autonomous vehicle subsystem 402 includes map database 402A, radar devices 402B, Lidar devices 402C, digital cameras 402D, sonar devices 402E, GPS receivers 402F, and inertial measurement units 402G. Each of the components of autonomous vehicle subsystem 402 comprise standard components provided in most current autonomous vehicles. In one embodiment, map database 402A stores a plurality of high-definition three-dimensional maps used for routing and navigation. Radar devices 402B, Lidar devices 402C, digital cameras 402D, sonar devices 402E, GPS receivers 402F, and inertial measurement units 402G may comprise various respective devices installed at various positions throughout the autonomous vehicle as known in the art. For example, these devices may be installed along the perimeter of an autonomous vehicle to provide location awareness, collision avoidance, and other standard autonomous vehicle functionality.

Vehicular subsystem 406 is additionally included within the system. Vehicular subsystem 406 includes various anti-lock braking systems 406A, engine control units 402B, and transmission control units 402C. These components may be utilized to control the operation of the autonomous vehicle in response to the streaming data generated by autonomous vehicle subsystem 402A. The standard autonomous vehicle interactions between autonomous vehicle subsystem 402 and vehicular subsystem 406 are generally known in the art and are not described in detail herein.

The processing side of the system includes one or more processors 410, short-term memory 412, an RF system 414, graphics processing units (GPUs) 416, long-term storage 418 and one or more interfaces 420.

The one or more processors 410 may comprise central processing units, FPGAs, or any range of processing devices needed to support the operations of the autonomous vehicle. Memory 412 comprises DRAM or other suitable volatile RAM for temporary storage of data required by processors 410. RF system 414 may comprise a cellular transceiver and/or satellite transceiver. Long-term storage 418 may comprise one or more high-capacity solid-state drives (SSDs). In general, long-term storage 418 may be utilized to store, for example, high-definition maps, routing data, and any other data requiring permanent or semi-permanent storage. GPUs 416 may comprise one more high throughput GPU devices for processing data received from autonomous vehicle subsystem 402A. Finally, interfaces 420 may comprise various display units positioned within the autonomous vehicle (e.g., an in-dash screen).

The system additionally includes a reporting subsystem 404 which performs data collection (e.g., collection of data obtained from sensors of the vehicle that is used to drive the vehicle). The reporting subsystem 404 includes a sensor monitor 404A which is connected to bus 408 and records sensor data transmitted on the bus 408 as well as any log data transmitted on the bus. The reporting subsystem 404 may additionally include one or more endpoints to allow for system components to transmit log data directly to the reporting subsystem 404.

The reporting subsystem 404 additionally includes a packager 404B. In one embodiment, packager 404B retrieves the data from the sensor monitor 404A or endpoints and packages the raw data for transmission to a central system. In some embodiments, packager 404B may be configured to package data at periodic time intervals. Alternatively, or in conjunction with the foregoing, packager 404B may transmit data in real-time and may compress data to facilitate real-time communications with a central system.

The reporting subsystem 404 additionally includes a batch processor 404C. In one embodiment, the batch processor 404C is configured to perform any preprocessing on recorded data prior to transmittal. For example, batch processor 404C may perform compression operations on the data prior to packaging by packager 404B. In another embodiment, batch processor 404C may be configured to filter the recorded data to remove extraneous data prior to packaging or transmittal. In another embodiment, batch processor 404C may be configured to perform data cleaning on the recorded data to conform the raw data to a format suitable for further processing by the central system.

Each of the devices is connected via a bus 408. In one embodiment, the bus 408 may comprise a controller area network (CAN) bus. In some embodiments, other bus types may be used (e.g., a FlexRay or MOST bus). Additionally, each subsystem may include one or more additional busses to handle internal subsystem communications (e.g., LIN busses for lower bandwidth communications).

Closing

The disclosure includes various devices which perform the methods and implement the systems described above, including data processing systems which perform these methods, and computer readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

As used herein, "coupled to" generally refers to a connection between components, which can be an indirect communicative connection or direct communicative connection (e.g., without intervening components), whether wired or wireless, including connections such as electrical, optical, magnetic, etc.

In this description, various functions and operations may be described as being performed by or caused by software code to simplify description. However, those skilled in the art will recognize what is meant by such expressions is that the functions result from execution of the code by one or more processors, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computing device or other system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions.

In general, a tangible or non-transitory machine readable medium includes any mechanism that provides (e.g., stores) information in a form accessible by a machine (e.g., a computer, mobile device, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by a computing device.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface.

Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, etc. The physical host interface can be used to transmit data between the host system and the memory sub-system. The host system can further utilize an NVM Express (NVMe) interface to access memory components of the memory sub-system when the memory sub-system is coupled with the host system by the PCIe interface. The physical host interface can provide an interface for passing control, address, data, and other signals between the memory sub-system and the host system. In general, the host system can access multiple memory sub-systems via a same communication connection, multiple separate communication connections, and/or a combination of communication connections.

In one embodiment, the host system includes a processing device and a controller. The processing device of the host system can be, for example, a microprocessor, a graphics processing unit, a central processing unit (CPU), an FPGA, a processing core of a processor, an execution unit, etc. In one example, the processing device can be a single package that combines an FPGA and a microprocessor, in which the microprocessor does most of the processing, but passes off certain predetermined, specific tasks to an FPGA block. In one example, the processing device is a soft microprocessor (also sometimes called softcore microprocessor or a soft processor), which is a microprocessor core implemented using logic synthesis. The soft microprocessor can be implemented via different semiconductor devices containing programmable logic (e.g., ASIC, FPGA, or CPLD).

In some examples, the controller is a memory controller, a memory management unit, and/or an initiator. In one example, the controller controls the communications over a bus coupled between the host system and the memory sub-system.

In general, the controller can send commands or requests to the memory sub-system for desired access to the memory components. The controller can further include interface circuitry to communicate with the memory sub-system. The interface circuitry can convert responses received from the memory sub-system into information for the host system. The controller of the host system can communicate with the controller of the memory sub-system to perform operations such as reading data, writing data, or erasing data at the memory components and other such operations.

In some instances, a controller can be integrated within the same package as the processing device. In other instances, the controller is separate from the package of the processing device. The controller and/or the processing device can include hardware such as one or more integrated circuits and/or discrete components, a buffer memory, a cache memory, or a combination thereof. The controller and/or the processing device can be a microcontroller, special purpose logic circuitry (e.g., a field programmable gate array (FPGA), an application specific integrated circuit (ASIC), etc.), or another suitable processor.

The memory components can include any combination of the different types of non-volatile memory components and/or volatile memory components. An example of non-volatile memory components includes a negative-and (NAND) type flash memory. Each of the memory components can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system. Although non-volatile memory components such as NAND type flash memory are described, the memory components can be based on any other type of memory such as a volatile memory.

In some embodiments, the memory components can be, but are not limited to, random access memory (RAM), read-only memory (ROM), dynamic random access memory (DRAM), synchronous dynamic random access memory (SDRAM), phase change memory (PCM), magneto random access memory (MRAM), Spin Transfer Torque (STT)-MRAM, ferroelectric random-access memory (FeTRAM), ferroelectric RAM (FeRAM), conductive bridging RAM (CBRAM), resistive random access memory (RRAM), oxide based RRAM (OxRAM), negative-or (NOR) flash memory, electrically erasable programmable read-only memory (EEPROM), nanowire-based non-volatile memory, memory that incorporates memristor technology, and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components can be grouped as memory pages or data blocks that can refer to a unit of the memory component used to store data.

The controller of the memory sub-system can communicate with the memory components to perform operations such as reading data, writing data, or erasing data at the memory components and other such operations (e.g., in response to commands scheduled on a command bus by a controller). A controller can include a processing device (processor) configured to execute instructions stored in local memory. The local memory of the controller can include an embedded memory configured to store instructions for performing various processes, operations, logic flows, and routines that control operation of the memory sub-system, including handling communications between the memory sub-system and the host system. In some embodiments, the local memory can include memory registers storing memory pointers, fetched data, etc. The local memory can also include read-only memory (ROM) for storing micro-code. While the example memory sub-system includes the controller, in another embodiment of the present disclosure, a memory sub-system may not include a controller, and can instead rely upon external control (e.g., provided by an external host, or by a processor or controller separate from the memory sub-system).

In general, the controller can receive commands or operations from the host system and can convert the commands or operations into instructions or appropriate commands to achieve the desired access to the memory components. The controller can be responsible for other operations such as wear leveling operations, garbage collection operations, error detection and error-correcting code (ECC) operations, encryption operations, caching operations, and address translations between a logical block address and a physical block address that are associated with the memory components. The controller can further include host interface circuitry to communicate with the host system via the physical host interface. The host interface circuitry can convert the commands received from the host system into command instructions to access the memory components as well as convert responses associated with the memory components into information for the host system.

The memory sub-system can also include additional circuitry or components that are not illustrated. In some embodiments, the memory sub-system can include a cache or buffer (e.g., DRAM or SRAM) and address circuitry (e.g., a row decoder and a column decoder) that can receive an address from the controller and decode the address to access the memory components.

What is claimed is:

1. A method comprising:
receiving, by a supplier from a vehicle manufacturer, a first printed document including specifications for a product to be integrated into a vehicle, wherein the first printed document further includes a first encoded image, the first encoded image including first parameters that identify a manufacturing process;
scanning, by a scanner of the supplier, the first encoded image to obtain the first parameters;
manufacturing, by the supplier using the manufacturing process identified by the first parameters, a sample of the product;
sending, by the supplier to the vehicle manufacturer, the sample with a second printed document indicating that the sample was made using the specifications, wherein the second printed document includes a second encoded image, the second encoded image including the first parameters, and further including second parameters related to process conditions during manufacture of the sample using the manufacturing process;
receiving, by the supplier from the vehicle manufacturer in response to the second printed document, a third printed document that corresponds to revisions to the specifications, wherein the third printed document includes a third encoded image, the third encoded image including the first parameters;
scanning, by at least one computing device of the supplier, the third encoded image;
determining, by the at least one computing device and based at least on scanning the third encoded image, that the third printed document corresponds to the second printed document; and
in response to determining that the third printed document corresponds to the second printed document, manufacturing, by the supplier, the product according to the revisions to the specifications.

2. The method of claim 1, wherein the first encoded image is generated by the at least one computing device, or by a computing device of the vehicle manufacturer.

3. The method of claim 1, wherein the revisions to the specifications are first revisions, the method further comprising sending, to the vehicle manufacturer in response to receiving the third printed document, a fourth printed document including second revisions to the specifications, wherein the fourth printed document further includes a fourth encoded image, the fourth encoded image including the first parameters.

4. The method of claim 1, wherein the first printed document is a production part approval process (PPAP) document, the method further comprising:

printing an updated PPAP document that includes the revisions to the specifications, wherein the updated PPAP document includes a fourth encoded image, the fourth encoded image including the first parameters;

sending, to the vehicle manufacturer, the updated PPAP document.

5. The method of claim 1, wherein the revisions are first revisions, and the first printed document is a production part approval process (PPAP) document, the method further comprising:

sending, to the vehicle manufacturer, a printed product change notification (PCN) document that includes second revisions to the specifications;

receiving, from the vehicle manufacturer, an approval of the PCN document;

in response to receiving the approval of the PCN document, sending, to the vehicle manufacturer, an updated production part approval process (PPAP) document that includes the second revisions, wherein the updated PPAP document includes a fourth encoded image, the fourth encoded image including the first parameters.

6. The method of claim 1, further comprising:

comparing parameters obtained from scanning the first and third encoded images; and based on comparing the parameters, generating a report indicating at least one parameter that differs from the first parameters.

7. The method of claim 6, further comprising at least one of displaying the report in a user interface of a mobile device, or sending the report to the vehicle manufacturer.

8. The method of claim 1, further comprising scanning the second encoded image, wherein determining that the third printed document corresponds to the second printed document comprises:

determining from scanning the third encoded image that the third encoded image includes the first parameters; and determining from scanning the second encoded image that the second encoded image includes the first parameters.

9. The method of claim 1, wherein the first parameters uniquely correspond to at least one of:

a sample made according to the specifications or the revisions to the specifications; or a printed production part approval process (PPAP) document that corresponds to the specifications or the revisions to the specifications.

10. The method of claim 1, wherein the first parameters include parameters regarding at least one of type of package, mold compound type, wire bond material, leadframe material, substrate material, or thermal resistance.

11. The method of claim 1, wherein the first parameters include a manufacturer part number of the product, and a description of the product.

12. The method of claim 1, wherein scanning the third encoded image comprises obtaining a link, the method further comprising accessing, using the link, stored data associated with the specifications.

13. The method of claim 12, wherein the stored data comprises drawings or diagrams of the product.

14. The method of claim 12, wherein the stored data is accessed by a mobile device, the method further comprising displaying at least a portion of the stored data in a user interface of the mobile device.

15. The method of claim 1, further comprising:

scanning the second encoded image, wherein scanning the second encoded image provides a unique version identifier associated with the sample; and identifying stored data associated with the sample using the unique version identifier.

16. The method of claim 1, further comprising:

sending the first printed document to a subcontractor that supplies a component used to manufacture the product;

receiving a fourth printed document from the subcontractor that accompanies the component, the fourth printed document including a fourth encoded image that includes the first parameters;

scanning the fourth encoded image to obtain the first parameters; and based on the first parameters obtained from scanning the fourth encoded image, authorizing use of the component in manufacturing the product.

17. The method of claim 1, further comprising:

generating a fourth printed document including a fourth encoded image that includes the first parameters;

sending the fourth printed document to a distributor facility; and shipping the manufactured product to the distributor facility;

wherein:
the fourth encoded image is scanned at the distributor facility;
the product is shipped, based on scanning the fourth encoded image at the distributor facility, to the vehicle manufacturer;
the vehicle manufacturer scans the fourth encoded image to confirm authenticity of the product; and
in response to confirming the authenticity of the product, the vehicle manufacturer integrates the product into the vehicle.

18. A system comprising:

at least one processing device; and memory containing instructions configured to instruct the at least one processing device to:

receive, from a manufacturer, a first printed document including specifications for a product, wherein the first printed document further includes a first encoded image, the first encoded image including first parameters that identify a manufacturing process;

scan the first encoded image to obtain the first parameters;

send, to the manufacturer, a second printed document, wherein the second printed document includes a second encoded image, the second encoded image including the first parameters, and further including second parameters related to process conditions associated with the manufacturing process;

receive, from the manufacturer in response to the second printed document, a third printed document that corresponds to revisions to the specifications, wherein the third printed document includes a third encoded image, the third encoded image including the first parameters;

scan the third encoded image;

determine, based at least on scanning the third encoded image, that the third printed document corresponds to the second printed document; and in response to determining that the third printed document corresponds to the second printed document, perform at least one action associated with the specifications.

19. The system of claim 18, wherein determining that the third printed document corresponds to the second printed document comprises comparing parameters obtained from scanning the third encoded image to parameters obtained from scanning the second encoded image.

20. A non-transitory computer storage medium storing instructions which, when executed on a computing device, cause the computing device to at least:
- receive, from a manufacturer, a first printed document including specifications for a first product to be integrated as a component into another product, wherein the first printed document further includes a first encoded image, the first encoded image including first parameters that identify a manufacturing process;
- scan the first encoded image to determine the identified manufacturing process;
- send, to the manufacturer, a second printed document, wherein the second printed document includes a second encoded image, the second encoded image including the first parameters, and further including second parameters related to process conditions associated with the manufacturing process;
- receive, from the manufacturer in response to the second printed document, a third printed document that corresponds to revisions to the specifications, wherein the third printed document includes a third encoded image, the third encoded image including the first parameters;
- scan the third encoded image;
- determine, based at least on scanning the third encoded image, that the third printed document corresponds to at least one of the first printed document or the second printed document; and
- in response to determining that the third printed document corresponds to at least one of the first printed document or the second printed document, manufacture the first product according to the revisions to the specifications.

\* \* \* \* \*